United States Patent
Abarra et al.

(10) Patent No.: US 9,422,623 B2
(45) Date of Patent: Aug. 23, 2016

(54) ION BEAM GENERATOR AND ION BEAM PLASMA PROCESSING APPARATUS

(71) Applicant: CANON ANELVA CORPORATION, Kawasaki-shi (JP)

(72) Inventors: Einstein Noel Abarra, Kawasaki (JP); Yasushi Kamiya, Kawasaki (JP); Yuta Konno, Kawasaki (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 297 days.

(21) Appl. No.: 14/155,655

(22) Filed: Jan. 15, 2014

(65) Prior Publication Data

US 2014/0124363 A1  May 8, 2014

Related U.S. Application Data

(63) Continuation of application No. PCT/JP2012/004450, filed on Jul. 10, 2012.

(30) Foreign Application Priority Data

Jul. 20, 2011  (JP) ................................ 2011-158977

(51) Int. Cl.
  *C23C 14/00*  (2006.01)
  *C23C 14/46*  (2006.01)
  *H01J 37/32*  (2006.01)

(52) U.S. Cl.
  CPC ........... *C23C 14/46* (2013.01); *H01J 37/32412* (2013.01); *H01J 2237/08* (2013.01)

(58) Field of Classification Search
  CPC .................. C23C 14/46; C23C 14/221; H01J 37/324142; H01J 2237/08
  See application file for complete search history.

(56) References Cited

U.S. PATENT DOCUMENTS

| 4,901,667 A | * | 2/1990 | Suzuki | C23C 16/452 118/715 |
| 5,102,523 A | * | 4/1992 | Beisswenger | H01J 37/32009 118/723 E |
| 5,391,281 A | * | 2/1995 | Hieronymi | H01J 37/32458 204/192.32 |
| 6,885,445 B2 | | 4/2005 | Bennett et al. | |

(Continued)

FOREIGN PATENT DOCUMENTS

| JP | 2-14517 A | 1/1990 |
| JP | 2-183954 A | 7/1990 |

(Continued)

OTHER PUBLICATIONS

International Search Report issued in PCT/JP2012/004450, mailed Oct. 16, 2012 (4 pages).

*Primary Examiner* — John Brayton
(74) *Attorney, Agent, or Firm* — Fitzpatrick, Cella, Harper & Scinto

(57) ABSTRACT

The invention provides: an ion beam generator and an ion beam plasma processing apparatus including a movable member (for example, a plug) which is capable of reducing formation of an adhering film on a sidewall of the member even when an electrode included in a grid assembly is sputtered. The ion beam generator of an aspect of the invention includes: a grid assembly provided opposed to an upper wall; a plug movable in a first direction from the upper wall toward the grid assembly and in a second direction from the grid assembly toward the upper wall; and a shield configured to shield a sidewall of the plug.

6 Claims, 12 Drawing Sheets

(56) References Cited

U.S. PATENT DOCUMENTS

| | | |
|---|---|---|
| 7,183,716 B2 | 2/2007 | Kanarov et al. |
| 7,557,362 B2 | 7/2009 | Yevtukhov et al. |
| 8,158,016 B2 | 4/2012 | Hayes et al. |
| 8,356,575 B2 | 1/2013 | Sasaki et al. |
| 2003/0042227 A1* | 3/2003 | Fink .................. H01J 37/32871 216/63 |
| 2004/0157445 A1* | 8/2004 | Fink .................. H01J 37/32623 438/689 |
| 2004/0163766 A1 | 8/2004 | Kanarov et al. |
| 2006/0284105 A1 | 12/2006 | Yamashita et al. |
| 2007/0194245 A1 | 8/2007 | Yevtukhov et al. |
| 2008/0179284 A1 | 7/2008 | Hayes et al. |
| 2012/0211166 A1 | 8/2012 | Yevtukhov et al. |

FOREIGN PATENT DOCUMENTS

| | | |
|---|---|---|
| JP | 6-310065 A | 4/1994 |
| JP | 9-245704 A | 9/1997 |
| JP | 2002-514747 A | 5/2002 |
| JP | 2006-351374 A | 12/2006 |
| JP | 2010-519710 A | 6/2010 |
| JP | 2011-124215 A | 6/2011 |
| WO | 2007-029777 A1 | 3/2007 |

* cited by examiner

ION BEAM GENERATOR AND ION BEAM PLASMA PROCESSING APPARATUS

CROSS-REFERENCES TO RELATED APPLICATIONS

This application is a continuation application of International Application No. PCT/JP2012/004450, filed Jul. 10, 2012, which claims the benefit of Japanese Patent Application No. 2011-158977, filed Jul. 20, 2011. The contents of the aforementioned applications are incorporated herein by reference in their entireties.

TECHNICAL FIELD

The present invention relates to an ion beam generator and an ion beam plasma processing apparatus using the same.

BACKGROUND ART

Ion beam etching has been used in various applications, for example in etching for manufacturing magnetic read sensors, magnetic writers, sliders and the like for disk drive data storages, as well as in sputtering targets for film formation.

Homogeneous broad ion beams are needed to obtain good etching uniformity. For example, the homogeneous broad ion beam can be achieved by controlling a plasma density profile in the vicinity of porous electrodes (a grid) for ion extraction, or by zoning the grid. In this respect, the plasma density profile means a change in the charge density of plasma observed in the traverse direction of a plasma chamber (for example, an ion beam source) in the vicinity of the bottom wall of the plasma chamber. In the case of a cylindrical plasma chamber, the plasma density profile is measured along the diameter of the cylindrical plasma chamber near and above the bottom wall. The zoning means adjusting the diameters of individual holes (also referred to as apertures) in the grid in order to compensate for the non-uniformity of the plasma. Although this zoning is effective, the effect is limited to certain grids.

It is desirable to provide the plasma density profile with the uniformity equivalent to the required etching uniformity. An electromagnet coaxial with the ion beam source chamber may be used for improving or controlling the plasma density in the plasma chamber. Generally speaking, a magnetic field generated in the center of an electromagnet is formed in the axial direction of a typical cylindrical plasma chamber. The electromagnet may be placed near an upper or side wall of the plasma chamber (see Patent Document 1).

Another method of controlling the plasma density profile is to use a movable plug or a movable recessed container provided on the upper wall. Generally speaking, the plasma density is highest in the middle of the chamber; and as the plug is placed to extend inside the plasma chamber from the vicinity of the center of the upper wall, the plasma portion is changed in shape, whereby the plasma density profile becomes more homogeneous. The movement of the plug is useful to control the plasma density profile in various process conditions. An electromagnet or permanent magnet may be additionally placed inside the plug for the purpose of controlling the plasma density profile under the plug, or confining plasma around the plug to the vicinity of the edge of the bottom surface of the plug. The above-mentioned plasma shaping method is effective to compensate for tolerances of component parts, and to compensate for slight variations in the grids which occur after long-term use or regeneration processing for cleaning. For a workplace that requires multiple tools and processes for compensation, the capability of controlling the plasma density profile is very helpful, for example, in obtaining a specific etching profile for correcting the non-uniformity on the workpiece resulting from a preceding process.

Meanwhile, as disclosed in Patent Document 2, plasma in an ion beam chamber can be changed in shape by use of a movable plug for the purpose of controlling the plasma density profile.

FIG. 1 is a cross-sectional diagram of a conventional plasma ion beam source disclosed in Patent Document 2. In FIG. 1, a plug 2 is inserted in the inside of a cylindrical plasma chamber 1 from an opening formed in the upper wall of the plasma chamber 1. A grid assembly 4 is provided in the bottom portion of the plasma chamber 1. An RF coil 5 is provided around the side wall of the plasma chamber 1. A gas introduction port 6 is provided in the upper wall of the plasma chamber 1. Furthermore, an O-ring 3 is provided between the wall surface of the opening formed in the upper wall of the plasma chamber 1 and the plug 2 inserted in the opening. The plug 2 is configured to be movable in arrow directions in FIG. 2. Moreover, a bottom surface 2a of the plug 2 is provided with an extended portion 7 in a predetermined shape for fine adjustment of the distribution of the plasma.

In FIG. 1, an inert gas (argon, xenon, krypton or the like) is introduced into the plasma chamber 1 from the gas introduction port 6. Once high-frequency power is applied to the RF coil 5, plasma is generated inside the plasma chamber 1. Ions are extracted from the plasma by the grid assembly 4 as extraction electrodes to each of which a predetermined voltage is applied, and forms an ion beam. The ion beam is radiated to a member (substrate) to be processed.

The grid assembly 4 includes a first electrode (screen grid) 4a, a second electrode (acceleration grid) 4b and a third electrode (deceleration grid) 4c arranged in that order from the inner side of the plasma chamber 1. Each of the first electrode 4a, the second electrode 4b and the third electrode 4c is a porous plate electrode having a grid structure with multiple holes. From a viewpoint of life extension and durability, molybdenum or carbon having a low sputtering rate is used as their component material (grid material). As shown in FIG. 2, the first electrode 4a is connected to a first power supply (not illustrated), and maintained at the positive potential; the second electrode 4b is connected to a second power supply (not illustrated), and maintained at the negative potential; and the third electrode 4c is connected to the earth.

In this configuration, when the plasma is generated in the plasma chamber 1 and the positive voltage and the negative voltage are respectively applied to the first electrode 4a and the second electrode 4b, only ions in the plasma in the plasma chamber 1 are extracted by electrostatic acceleration by the grid assembly 4 due to the difference in potential between the first electrode 4a and the second electrode 4b. Thereby, an ion beam 24 as shown in FIG. 2 as emitted from the ion beam source. In this respect, the angle of deflection of the ion beam 24 extracted from third electrode 4c with respect to the central axis of the hole is referred as to a beam divergence angle θ. The technique disclosed in Patent Document 2 adjusts the plasma density profile by moving the plug 2 in the arrow directions in FIG. 1.

CITATION LIST

Patent Documents

Patent Document 1: Published Japanese Translation of PCT International Application No. 2010-519710
Patent Document 2: U.S. Pat. No. 7,183,716, Description

SUMMARY OF INVENTION

In the technique of forming the ion beam by extracting the ions from the plasma chamber including the movably-provided plug and the grid assembly as shown in Patent Document 2, as adhering substance is more likely to be deposited on particular electrodes (the first electrode 4a and the third electrode 4c) included in the grid assembly 4.

Descriptions will be hereinbelow provided for the principle that adhering films are deposited on the first electrode 4a and the third electrode 4c.

Since the negative voltage is applied to the second electrode 4b, it is likely that: positively-charged ions are attracted to the second electrode 4b; and the electrode material of the second electrode 4b is sputtered with the ions. The thus-sputtered electrode material of the second electrode 4b adheres to surfaces of the first electrode 4a and the third electrode 4c which face the second electrode 4b, and forms adhering films 21a, 21b thereon. To put it specifically, part of the neutral gas (denoted by reference sign "n" in FIG. 2) introduced into the plasma chamber 1 ionizes between the electrodes through its charge exchange reaction with extracted ions 23, and turns into low-speed ions (+L). The charge exchange reaction is a phenomenon in which particles exchange only charges with one another while keeping their kinetic momentum. For the distinguishing purpose, the above-mentioned ion beam 24 is referred to as high-speed ions (+H). The high-speed ions are accelerated and deflected by electrostatic fields (not illustrated) caused by the voltages of the respective electrodes, and ejected from the third electrode 4c without colliding against the electrodes. On the other hand, the low-speed ions (+L), which hare not been accelerated yet, are accelerated by the negative potential of the second electrode 4b, thus collide against the second electrode 4b, and accordingly causes sputtering. The sputtered material of the second electrode 4b turns into sputter particles 25. Some of the sputter particles 25 adhere to the first electrode 4a and the third electrode 4c, and form the adhering films 21a, 21b.

Meanwhile, some of the sputter particles 25 fly into the plasma chamber 1. Once the sputter particles 25 derived from the second electrode 4b and reaching the inside of the plasma chamber 1 in this manner adhere to a sidewall portion 2b of the plug 2 which is the movable area of the plug 2, an adhering film 26 including the material of the second electrode 4b is formed on the sidewall portion 2b. As learned from FIG. 1, in the conventional technique, the plug 2 is moved by sliding the sidewall portion 2b, which is the movable area of the plug 2, over the O-ring 3. For this reason, the adhering film 26 formed on the sidewall portion 2b, which is the movable portion of the plug 2, may hamper the appropriate slide of the sidewall portion 2b over the O-ring 3. In addition, if more sputter particles 25 adhere to the sidewall portion, the adhering film 26 grows larger. In the worst case, the plug 2 gets stuck with the adhering film 26 thus grown larger.

The present invention has been made with the foregoing situation taken into consideration. An object of the present invention is to provide an ion beam generator including a movable member (for example, a plug) and to provide an ion beam plasma processing apparatus, which are capable of reducing the formation of an adhering film on a sidewall of the member even if one of electrodes included in a grid assembly is sputtered.

Another object of the present invention is to provide an ion beam generator and an ion beam plasma processing apparatus, which are capable of appropriately moving the movable member even if one of electrodes included in a grid assembly is sputtered and electrode-derived sputter particles are produced by the sputtering.

To attain the object, a first aspect of the present invention provides an ion beam generator which includes: a chamber; a unit configured to generate plasma in the chamber; an extraction unit provided opposed to a predetermined wall of the chamber, and configured to extract ions from the plasma; a member configured to adjust plasma density in the chamber, and be movable in the chamber in a first direction from the wall toward the extraction unit and in a second direction from the extraction unit toward the wall; a seal member configured to seal a gap between the wall and a sidewall of the member, and having a slidable relationship with the member; and a shield configured to at least partially cover portions of the sidewall of the member and the seal member which slide over each other with a movement of the member, and having at least a portion extending from the wall toward the extraction unit.

Meanwhile, a second aspect of the present invention provides an ion beam plasma processing apparatus which includes the ion beam generator of the first aspect.

Moreover, a third aspect of the present invention provides an ion beam generator which includes: a chamber; a unit configured to generate plasma in the chamber; an extraction unit provided opposed to a predetermined wall of the chamber, and configured to extract ions from the plasma; a member configured to adjust plasma density in the chamber, and be movable in the chamber in a first direction from the wall toward the extraction unit and in a second direction from the extraction unit toward the wall; and an expandable and contractible member configured to seal a gap between the wall and a sidewall of the member, and be expandable and contractible in the first and second directions.

In the present invention, the ion beam generator including the movable member (for example, the plug) can appropriately move the movable member even if one of the electrodes included in the grid assembly is sputtered.

DESCRIPTION OF EMBODIMENTS

Figure 1:
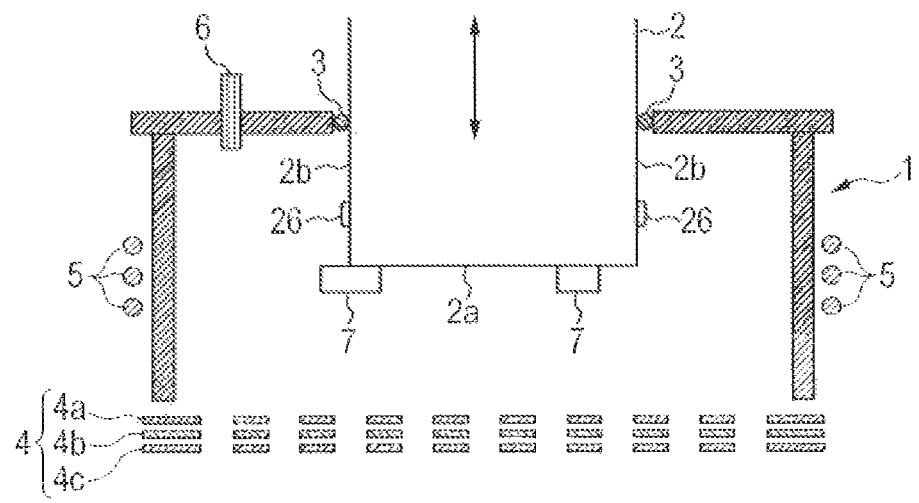
FIG. 1 is a cross-sectional diagram of a conventional ion beam source.

Referring to the drawings, descriptions will be hereinbelow provided for the embodiments of the present invention. It is to be noted, however, that the present invention is not limited to the embodiments. Here, components having the same function will be denoted by the same reference signs throughout the drawings to be described below, and duplicated descriptions will be omitted from time to time.

(First Embodiment)

Figure 3:
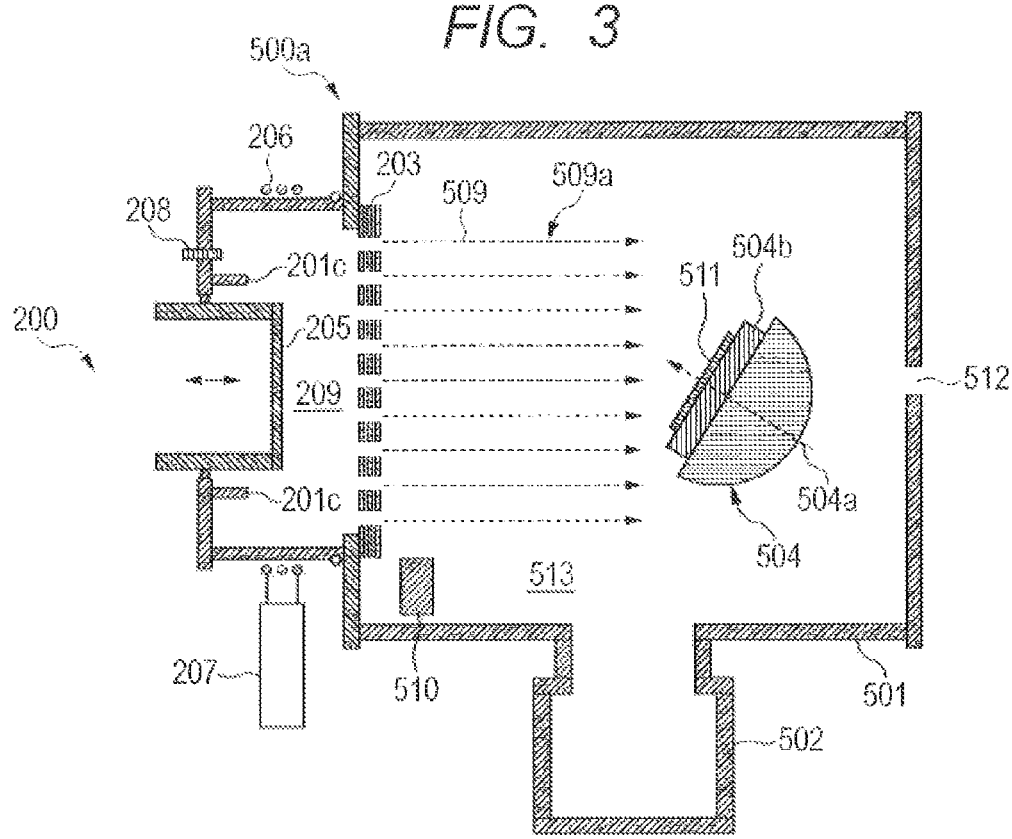
FIG. 3 is a cross-sectional diagram of an ion beam etching apparatus of an embodiment of the present invention.

FIG. 3 is a diagram for explaining an ion beam etching (IBE) apparatus 500a as an ion beam plasma processing apparatus of the embodiment. The IBE apparatus 500a includes: a process chamber 501 having a space 513; a pump 502 configured to evacuate a gas in the process chamber 501; an ion beam source (ion beam generator) 200; and a substrate holder 504. It should be noted that since the space 513 is an external space with respect to the ion beam generator 200 and the space inside the ion beam source will be referred to as an internal space (whose reference sign is 209 in this embodiment), the space 513 will be hereinafter referred to as the "external space 513" for the convenience sake.

The ion beam source 200 includes a radio-frequency inductively-coupled plasma (RF ICP) discharge chamber. As an extraction unit configured to extract ions, a grid assembly 203 is provided on one side of the RF ICP discharge chamber. A gas is introduced into the ion beam source 200 via an introduction pipe 208 provided to the ion beam source 200. An antenna 206 connected to a matching network 207 and configured to generate radio-frequency (RF) field is placed around the ion beam source 200 in order to generate plasma discharge in the internal space 209. Ions are extracted by the grid assembly 203 from the plasma discharge generated in the internal space 209, and turn into ion beamlets (beam currents) 509 in the external space 513. The ion beamlets 509 form broad ion beams 509a traveling toward a workpiece 511 set on a stage 504b on the substrate holder 504.

The workpiece 511 is inserted into the process chamber 501 through a slit 512 formed in one of the walls of the process chamber 501. An angle of the ion beams 509a to the workpiece 511 can be changed by inclining (tilting or panning) the substrate holder 504. In addition, the workpiece 511 can be loaded into the process chamber 501 and unloaded from the process chamber 501 while locating the substrate holder 504 at a non-inclined horizontal position. The workpiece 511 may be rotated about an axis 504a which is perpendicular to the surface of the workpiece 511 held on the stage 504b (or the surface of the stage 504b). To this end, the stage 504b only needs to be made rotatable about the axis 504a, for example. A neutralizer 510 configured to generate electrons in order to reduce the voltage in the broad ion beams 509a is provided for the purpose of preventing the workpiece 511 from being electrified, or for the purpose of reducing the electrification of the workpiece 511.

Figure 4:
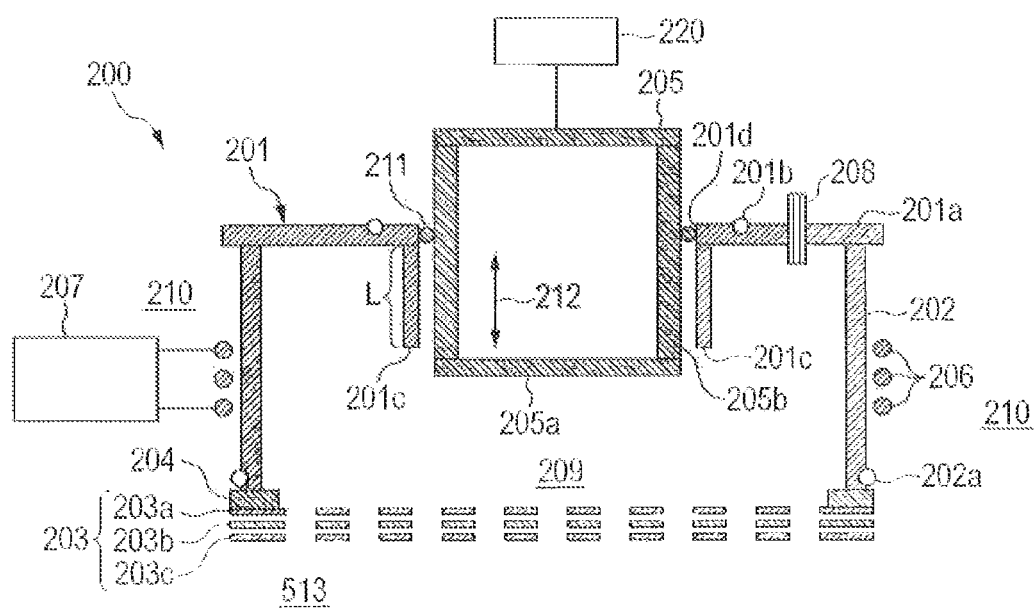
FIG. 4 is a cross-sectional diagram of an ion beam generator of the embodiment of the present invention.

FIG. 4 is a diagram showing the ion beam source of the embodiment. The following descriptions will be provided while focusing mainly on components for solving the problems with the conventional ion beam source. The ion beam source 200 is provided with an electric discharge chamber including: an upper wall 201 which is one of he inner walls of the electric discharge chamber (a predetermined wall of the electric discharge chamber); a cylindrical sidewall 202; and the grid assembly 203 also functioning as the bottom wall of the ion beam chamber 200. The upper wall 201 includes a flat and fixed round plate 201a. As a member movable in arrow directions 212 (a member provided movable in directions normal to an ion emission surface of the grid assembly 203 in the electric discharge chamber of the ion beam source 200), a plug 205 is inserted in an opening in the round plate 201a. The cylindrical plug 205 includes a circular bottom surface 205a and a sidewall 205b. The plug 205 is movable in the arrow directions 212 which are perpendicular to the surface (ion emission surface) of the grid assembly 203 functioning as the ion extraction surface. In other words, the plug 205 is movable in a first direction which is directed from the upper wall 201 to the grid assembly 203, and a second direction which is directed from the grid assembly 203 to the upper wall 201. The plug 205 is connected to a plug driving mechanism 220 which is an actuator or the like. The plug driving mechanism 220 is driven on the basis of drive commands from a control unit, albeit not illustrated, and accordingly, the plug 205 moves in the arrow directions 212 as needed. The movement of the plug 205 like this makes it possible to control the plasma density profile. In other words, the plug 205 functions as a member configured to adjust the plasma density in the electric discharge chamber. The shape of the plug 205 is not limited to the cylindrical shape, and may be a regular polygonal shape or a rectangular shape.

The grid assembly 203 is provided in an opposite portion of the electric discharge chamber from the upper wall 201 (a portion opposed to the upper wall 201) with an electrode placement ring 204 interposed in between. The grid assembly 203 includes a first electrode 203a, a second electrode 203b and a third electrode 203c. Each of the first electrode 203a, the second electrode 203b and the third electrode 203c is a porous plate electrode having a grid structure with multiple holes. From a viewpoint of life extension and durability, it is desirable that molybdenum or carbon be used as their component material (grid material) because of a low sputtering rate. In the embodiment, the first electrode 203a is connected to a first power supply (not illustrated), and maintained at a positive potential; the second electrode 203b is connected to a second power supply (not illustrated), and maintained at a negative potential; and the third electrode 203c is connected to the earth. In this manner, the potentials of the first to third electrodes 203a to 203c are controlled independently of one another. In this example, the first electrode 203a is maintained at the positive potential (for instance, 100 to 1000 V); the second electrode 203b is maintained at the negative potential (for instance, −1000 to −3000 V); and the third electrode 203c is maintained at the ground potential.

Once the positive potential and the negative potential are respectively applied to the first electrode 203a and the second electrode 203b after plasma is generated in the ion beam source 200, only ions are extracted from the plasma by electrostatic acceleration due to the difference in potential between the first electrode 203a and the second electrode 203b. On the other hand, the ions (positively-charged ions) extracted from the plasma are decelerated due to the difference in potential between the second electrode 203b and the third electrode 203c. For this reason, ions passing through the third electrode 203c are ejected as ion beams having energy equivalent to the potential of the first electrode 203a. The ion beams extracted from the third electrode 203c are deflected by an electrostatic field (not illustrated) caused by the voltages of the respective electrodes.

An O-ring 211 having a sliding relationship with the sidewall 205b and configured to seal the gap between the round plate 201a and the plug 205 is provided between the round plate 201a and the sidewall 205b of the plug 205. A groove (not illustrated) is formed in an inner peripheral sidewall 201d of the annular plate 201a, and the O-ring 211 is fixed to the groove. The O-ring 211 is designed to enable the plug 205 to move in the arrow directions 212. For example, the O-ring 211 and the sidewall 205b are configured such that the O-ring 211 fixed to the annular plate 201a and the sidewall 205b which is a movable area of the plug 205 can slide over each other. The embodiment is provided with the movable plug 205 by being provided with the O-ring 211. Even when the plug 205 is moved, the embodiment is capable of: reducing the leak of the gas from the internal space 209, which also serves as the electric discharge space of the ion beam source 200, into an outer region 210 outside the ion beam source 200 and the process chamber 501; and concurrently reducing the entry of impurities into the internal space 209 from the outer region 210.

In the embodiment, the annular plate 201a and the plug 205 may preferably be formed from aluminum or stainless steel. The potentials of the annular plate 201a and the plug 205 are set equal to that of the first electrode 203a.

It should be noted that the embodiment may apply a configuration to cool the ion beam source 200 by providing a cooling unit 202a to the sidewall 202 and a cooling unit 201b to the round plate 201a. The cooling unit 202a may be provided in the inside of the plug 205.

In addition, a shield 201c is formed on an inner edge of one round plate 201a on the side near the internal space 209. The shield 201c extends from the inner edge toward the grid assembly 203, and is disposed to surround at least part of the sidewall 205b of the plug 205. In the embodiment, the shield 201c is a cylinder designed to surround the plug 205, and one end of the cylinder is connected so the round plate 201a on the side near the internal space 209.

Figure 2:
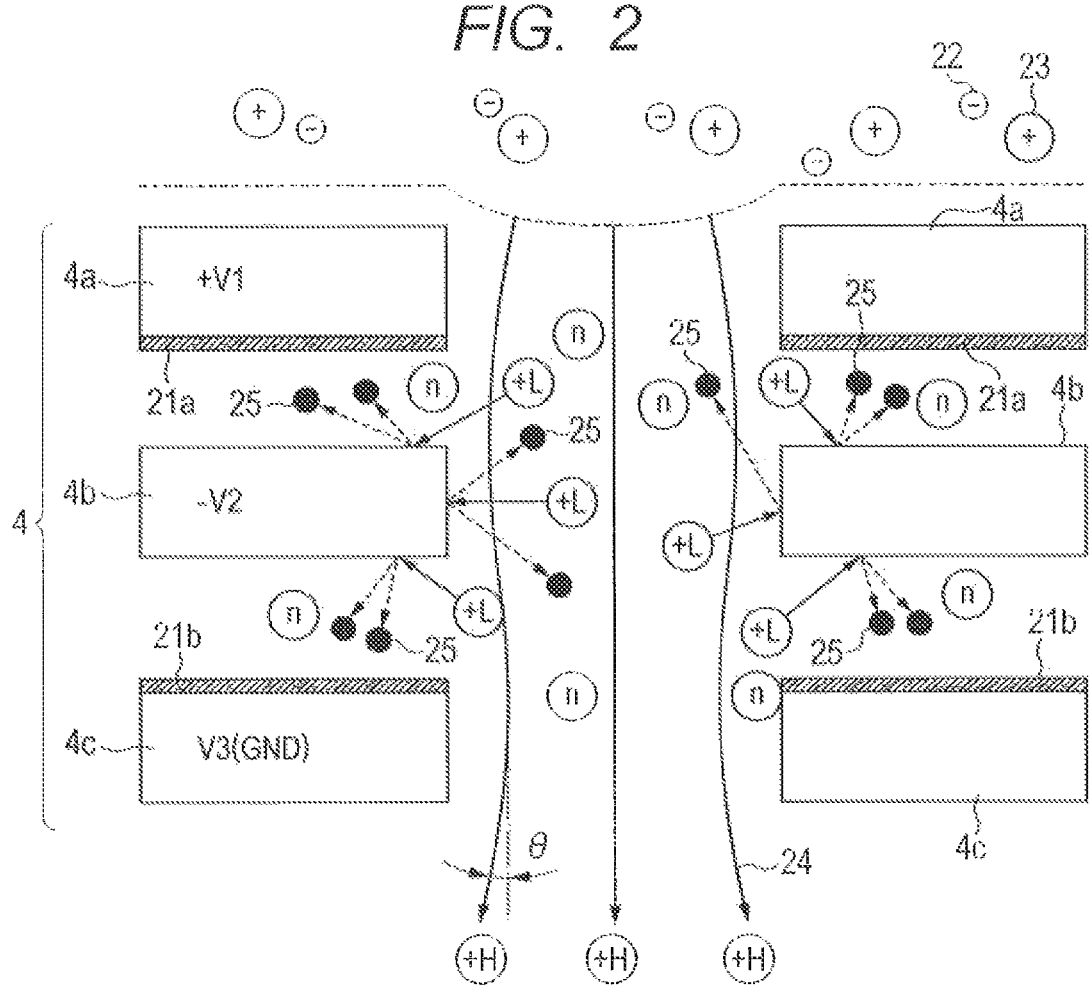
FIG. 2 is a diagram for explaining the principle that an adhering film is formed on electrodes included in a conventional grid assembly.

In the embodiment, the shield 201c makes it possible to prevent or reduce the accumulation of a film on the sidewall 205b of the plug 205 from the grid assembly 203 and the workpiece 511 (for example, a wafer) being subjected to the process. In particular, as explained in FIG. 2, even though sputter particles made from the material of the second electrode 203b are produced from the second electrode 203b and enter the electric discharge chamber of the ion beam source 200, the shield 201c can reduce the adhesion of the sputter particles to the sidewall 205b. Accordingly, even when the sputter particles derived from the second electrode 203b of the grid assembly 203 are produced, the plug 205 can be moved smoothly.

Furthermore, since the shield 201c extends from the inner edge (the edge of the opening) of the round plate 201a toward the grid assembly 203 along the sidewall 205b of the plug 205, it is possible to narrow the gap between the shield 201c and the sidewall 205b, and accordingly to decrease the conductance in this area. In other words, the placement of the shield at the inner edge portion makes it possible to reduce the gap between the shield 201c and the sidewall 205b to the size of the O-ring 211, and accordingly to make the conductance become as small as possible. Thus, it is possible to make the sputter particles become less likely to flow into the gap between the shield 201c and the sidewall 205b, and to further reduce the formation of the adhering film on the sidewall 205b. In this manner, the embodiment can exert the effect of making it possible to reduce the adhesion of the sputter particles derived from the second electrode 203b onto the sidewall 205b by decreasing the conductance in the area between the shield 201c and the sidewall 205b. As a result, if the conductance can be made as small as possible, the position of the placement of the shield 201c is not limited to the inner edge portion of the annular plate 201a, but may be set to a place away from the inner edge portion by a predetermined distance, for example. In short, the inner edge portion of the annular plate 201a or the vicinity of the inner edge portion is desirable as the position of the placement of the shield 201c since the conductance can be made as small as possible. It is desirable that the interval between the shield 201c and the sidewall 205b be equal to or less than the Debye length in order to allow no plasma to enter the gap between the shield 201c and the sidewall 205b.

Moreover, in the light of achieving the uniform plasma density profile by moving the plug 205, it is desirable that a wider space be secured in a region deviating from the center of the ion beam source 200 toward the sidewall 202. With this point taken into consideration, it is desirable that the shield 201c be provided to the upper wall 201 in a way that the shield 201c extends toward the grid assembly 203 from the upper wall 201 opposed to the grid assembly 203 along the sidewall 205b of the plug 205. That is because the placement will not block the spread of the plasma toward the upper wall 201 along the sidewall 202. Since, as described above, the shield 201c is provided to the upper wall 201 in a way that the shield 201c extends from the upper wall 201 toward the grid assembly 203, it is possible to simultaneously achieve the reduction in the adhesion of the sputter particles derived from the second electrode 203b onto the sidewall 205b, and the securing of the wider space in the region closer to the sidewall 202 inside the electric discharge chamber of the ion beam source 200. It should be noted that in the embodiment, the direction of extension of the shield 201c from the upper wall 201 toward the grid assembly 203 is in parallel with the direction of extension of the sidewall 205b from the upper wall 201 toward the grid assembly 203, the directions do not have to be in parallel with each other. In other words, it does not matter whether or not the two directions are in parallel with each other, as long as the shield 201c extending from the upper wall 201 towards the grid assembly 203 can achieve the reduction in the adhesion of the sputter particles onto the sidewall 205b and the securing of the wider space at the same time. The shape of the shield 201c may be one formed to spread from the upper wall 201 toward the grid assembly 203, or one which is tapered from the upper wall 201 toward the grid assembly 203.

Figure 22:
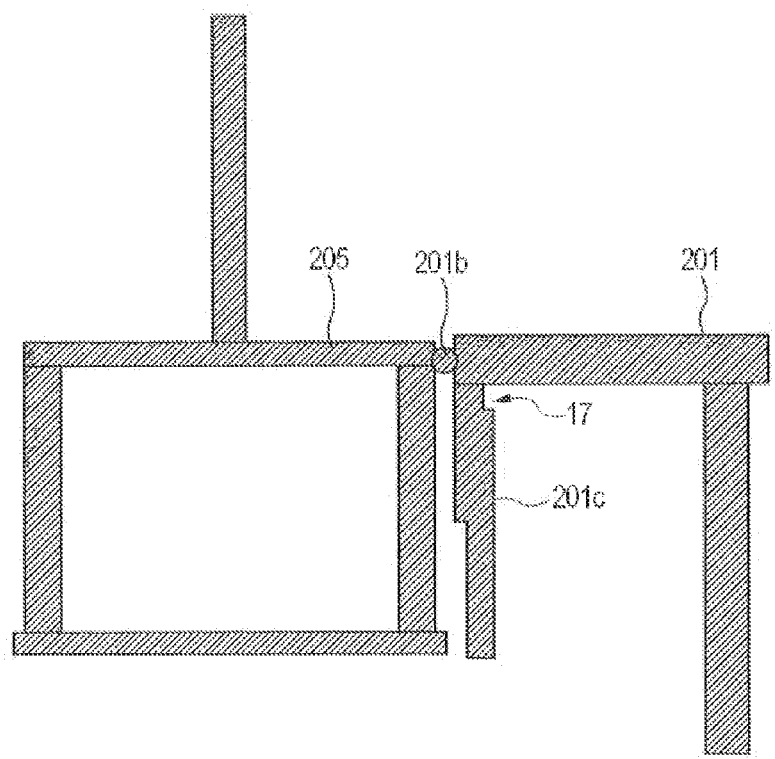
FIG. 22 is a cross-sectional diagram of a shield of an embodiment of the present invention.

What is more, it is desirable that the shield 201c have the same potential as the first electrode 203a, or a floating potential, in order that the plasma can be stably formed in the internal space 209. When the shield 201c is made to have the same potential as the first electrode 203a, a substance with a low coefficient of thermal expansion, such as Mo, Ti or $SiO_2$, is suitable as the material of the shield 201c. Meanwhile, when the shield 201c has a floating potential, an insulating material, such as quartz or alumina, is used as the material of the shield 201c. In this case, it is desirable that as shown in FIG. 22, a cut 17 be made in the shield 201c in a corner between the shield 201c and the upper wall 201 of the electric discharge chamber. By doing so, even though an adhering matter such as Mo adheres onto the shield 201c from the grid, it is possible to prevent the adhering matter from being completely connected to the upper wall of the chamber, and accordingly to maintain stable plasma.

Furthermore, it is desirable that the length L of the shield 201c be such a length that does not allow the shield 201c to interfere with the formation of the plasma density profile in the internal space 209. In other words, it is desirable that the length L of the shield 201c be set equal to or less than a length with which the plug 205 reaches the maximum movable range.

(Embodiment 2)

Generally speaking, a conventional practice is configured to provide a cylindrical ion beam source as physically symmetric as possible. The ion beam source, however, is provided with a component, such as an RF antenna, which destroys the symmetry. In the case of the RF antenna, the asymmetry decreases with multiple turns, but the coil inductance of the antenna increases. For this reason, the plasma density profile along the diameter of the chamber tends to become slightly asymmetrical even in a scrupulously-designed ion beam source. As the plasma density profile, a profile which is inclined in the middle of the plasma chamber in the diameter direction and is not flat near the sidewall of the plasma chamber may be formed instead of a profile which is flat in the middle thereof in the diameter direction and becomes symmetrical near the sidewall thereof. Generally speaking, the asymmetry is most often pointed out in terms of a specific diameter direction, while the plasma density profile is more symmetrical in terms of other directions. The directions in which the asymmetry is largest may change when some process conditions such as gas pressure and RF antenna power are changed. The asymmetry of the plasma density profile might not be a serious problem to the etching process which is carried out by turning a workpiece about a normal to the processed surface of the workpiece. However, under static conditions (for example, in the case of not turning the workpiece), it is hard to achieve appropriate uniformity, in particular, on larger workplaces and wafers (with a diameter of 8 inches or more). The enlargement of the ion beam chamber may be considered as a way to reduce the asymmetry of the profile on workplaces, but leads to an increase in costs.

On the other hand, the technique disclosed in Patent Document 2 controls the plasma density profile by: displacing the plasma in the ion beam chamber by use of the movable plug; and thus narrowing the space in the central area of the ion beam chamber. The controllability, however, is limited by the size (diameter) and shape of the plug.

Furthermore, in the conventional technique, as disclosed in Patent Document 2, of controlling the plasma density by use of the plug, a plasma density profile outside the plug area (outside the space right under the bottom surface of the plug) is changed immediately after the plug is operated, but a plasma density profile in the space under the plug remains almost unchanged. With this taken into consideration, various methods, such as a method in which the plug 2 is provided with the extended portion 7 as shown in FIG. 1, have been conventionally used. These methods, however, cannot deal with different process conditions flexibly, because each different condition requires an extended portion corresponding to the condition.

An object of the embodiment is to realize an ion beam source which is capable of: easily dealing with various conditions; and changing the plasma density profile n broader range.

Figure 5:
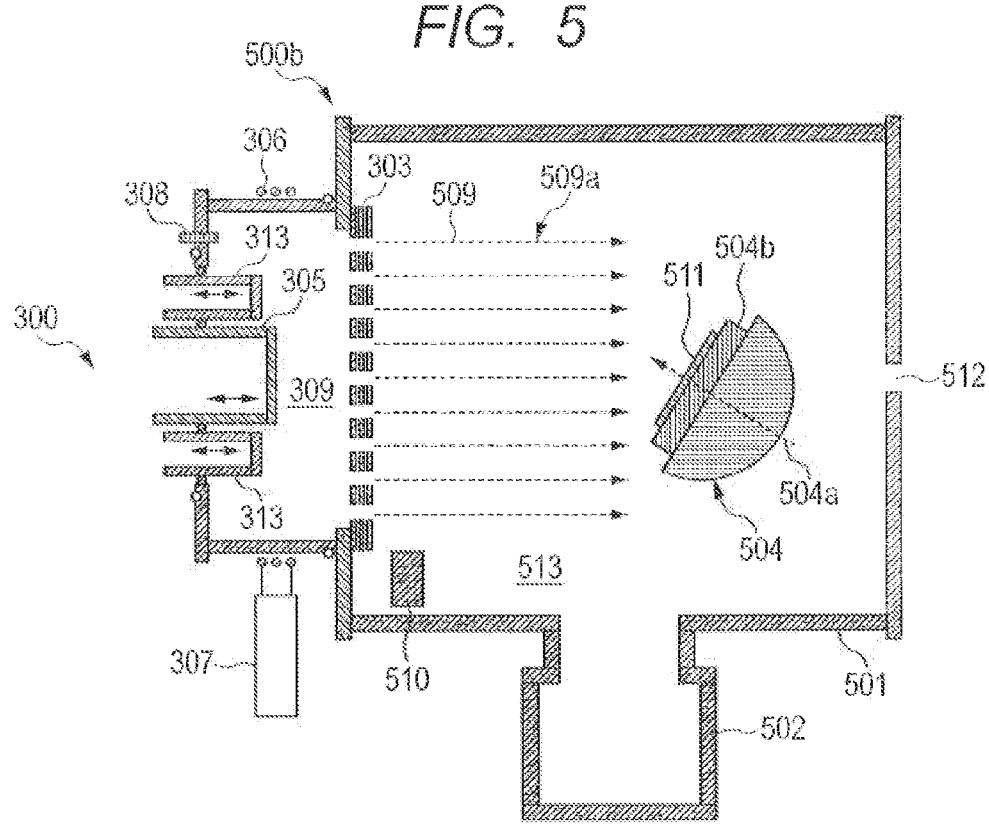
FIG. 5 is a cross-sectional diagram of an ion beam etching apparatus of an embodiment of the present invention.

FIG. 5 is a diagram for explaining an IBE apparatus 500b of the embodiment. The IBE apparatus 500b includes: the process chamber 501 having the space 513; the pump 502 configured to evacuate a gas from the inside of the process chamber 501; an ion beam source 300; and the substrate holder 504.

The ion beam source 300 includes an RF ICP discharge chamber. A grid assembly 303 configured to extract ions is provided on one side of the RF ICP discharge chamber. A gas is introduced into the ion beam source 300 via an orifice 308 provided to the ion beam source 300. An antenna 306 connected to a matching network 307 and configured to generate a radio-frequency (RF) field is placed around the ion beam source 300 in order to generate plasma discharge in an internal space 309. Ions are extracted by the grid assembly 303 from the plasma discharge generated in the internal space 309, and turn into ion beamlets 509 in the external space 513.

Figure 6:
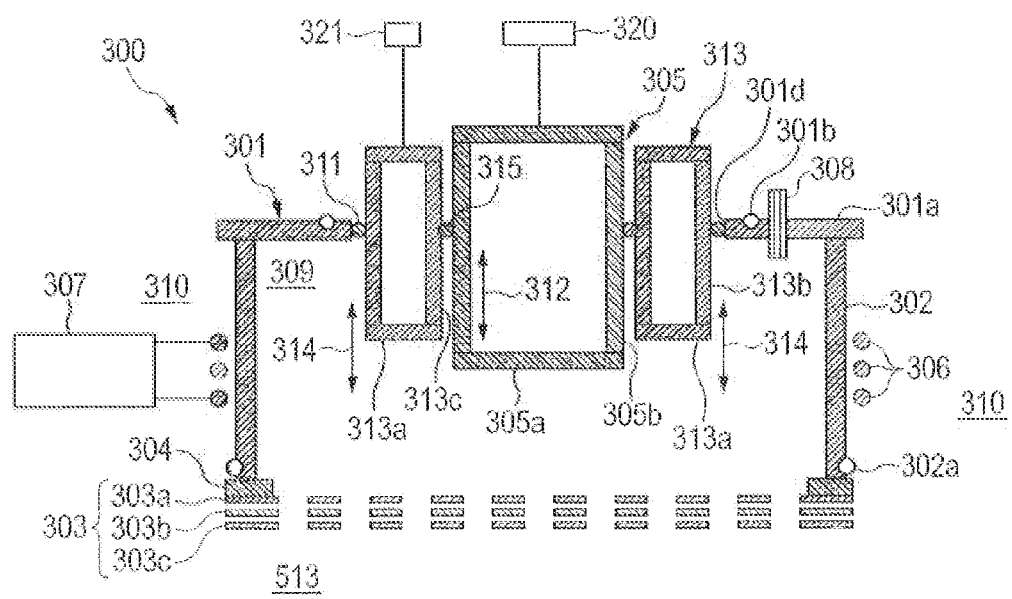
FIG. 6 is a cross-sectional diagram of an ion beam generator of the embodiment of the present invention.

FIG. 6 is a diagram showing the ion beam source of the embodiment. The ion beam source 300 is provided with an electric discharge chamber including: an upper wall 301; a cylindrical sidewall 302; and the grid assembly 303 also functioning as the bottom wall of the ion beam source 300. In addition, the grid assembly 303 includes a first electrode 303a, a second electrode 303b and a third electrode 303c. The first electrode 303a, the second electrode 303b and the third electrode 303c respectively correspond to the first electrode 203a, the second electrode 203b and the third electrode 203c which have been described in FIG. 4. The upper wall 301 has a flat and fixed annular plate 301a. At least two independently movable members (plugs), namely an inner plug (first plug) 305 and an outer plug (second plug) 313 of the embodiment, are inserted in an opening in the annular plate 301a. The inner plug 305 and the outer plug 313 may be coaxially provided in the middle inside the sidewall 302. The inner plug 305 includes a bottom surface 305a and a sidewall 305b. The inner plug 305 is movable in arrow directions 312 which are perpendicular to the surface of the grid assembly 303 also functioning as the ion extraction surface. In other words, the inner plug 305 is movable in a first direction which is directed from the upper wall 301 to the grid assembly 303, and in a second direction which is directed from the grid assembly 303 to the upper wall 301. The inner plug 305 is connected to an inner plug driving mechanism 320 which is an actuator or the like. The inner plug driving mechanism 320 is driven on the basis of drive commands from a control unit, albeit not illustrated, and accordingly, the inner plug 305 moves in the arrow directions 312 as needed.

On the other hand, the outer plug 313 provided outside the inner plug 305 and serving as a second member includes: an annular bottom surface 313a, an outer sidewall 313b and an inner sidewall 313c. The outer plug 313 is movable in arrow directions 314 which are in parallel with the arrow directions 312. In other words, the outer plug 313 is movable in the first direction which is directed from the upper wall 301 to the grid assembly 303, and in the second direction which is directed from the grid assembly 303 to the upper wall 301. The outer plug 313 is connected to an outer plug driving mechanism 321 which is an actuator or the like. The outer plug driving mechanism 321 is driven on the basis of drive commands from the control unit, albeit not illustrated, and accordingly, the outer plug 313 moves in the arrow directions 314 as needed.

An O-ring 311 is provided between the annular plate 301a and the outer sidewall 313b. An O-ring 315 is provided between the two plugs, or between the sidewall 305b of the inner plug 305 and the inner sidewall 313c of the outer plug 313. A groove (not illustrated) is formed in an inner-peripheral sidewall 301d of the annular plate 301a, and the O-ring 311 is fixed to the groove. In addition, if is desirable that: a groove (not illustrated) be formed in the sidewall 305b of the inner plug 305 in its circumferential direction; end an O-ring 315 be fixed to the groove. Needless to say, the groove to which the O-ring 315 is fixed may be formed in the inner sidewall 313c of the outer plug 313. The O-rings 311, 315 are designed to enable the plugs to operate. For examples the O-ring 311 and the outer sidewall 313b are designed to enable the outer sidewall 313b to slide over the O-ring 311 fixed to the annular plate 301a. Similarly, the O-ring 315 and the inner sidewall 313c are designed to enable the inner sidewall 313c to slide over the O-ring 315 fixed to the sidewall 305b. The embodiment provides the two independently movable plugs by providing the O-rings 311, 315. Even when at least one of the two plugs is moved, the embodiment is capable of: reducing the leak of the gas from the internal space 309, which also serves as the electric discharge space of the ion beam source 300, into an outer region 310 outside the ion beam source 300 and the process chamber 501; and concurrently reducing the entry of impurities into the internal space 309 from the outer region 310.

In the embodiment, the annular plate 301a, the inner plug 305 and the outer plug 313 may be formed from aluminum or stainless steel. The potentials of the annular plate 301a, the inner plug 305 and the outer plug 313 are set equal to that of the grid 303a.

It should be noted that the embodiment may apply a configuration to cool the ion beam source 300 by providing a cooling unit 302a to the sidewall 302 and a cooling unit 301b to the annular plate 301a. The cooling unit 302a may be provided in the inside of at least one of the inner plug 305 and the outer plug 313.

According to the above-described configuration, it is possible to expand the plasma shaping effect to a broader range by moving the inner plug 305 and the outer plug 313 independently of each other. In other words, the plasma shaping can be performed in the broader range. For example, when the bottom surface 305a and the bottom surface 313a are positioned at the same level, plasma density in an area outside the outer plug 313 can be changed immediately. In addition, when the bottom surface 313a is positioned relatively higher than the bottom surface 305a, plasma density under the bottom surface 313a can be changed (raised). When the bottom surface 305a is positioned relatively higher than the bottom surface 313a, plasma density under the bottom surface 305a and near the grid can be changed. It should be noted that the relative positioning of the inner plug 305 and the outer plug 313 may be dynamically changed during an operation for obtaining an optimal ion beam etching profile.

What it more, the embodiment is capable of positioning the inner plug 305 and the outer plug 313 relative to each other without evacuating the gas from the ion beam chamber. The conventional ion beam chamber shown in FIG. 1 requires the replacement of the extended portion 7 when conditions are changed, and accordingly requires the gas to be evacuated from the ion beam chamber before the replacement of the extended portion 7 to meet the conditions. Furthermore, an opening through which to put the extended portion 7 into the ion beam chamber needs to be additionally provided to the ion beam chamber. The embodiment, however, is capable of controlling the plasma density profile by only changing the relative positions of the inner plug 305 and the outer plug 313 without providing the extended portion 7. For this reason, the gas need no longer be evacuated from the electric discharge chamber in order to control the plasma density profile. Accordingly, the optimization of plasma for obtaining a desired ion beam etching profile can be quickened remarkably. Moreover, since the opening through which to introduce a member (for example, the extended portion 7) configured to control the plasma density profile need no longer be provided to the electric discharge chambers, the apparatus can be simplified.

As described above, the embodiment is capable of controlling the plasma density profile by: using the two plugs, namely the inner plug 305 and the outer plug 313; and controlling the relative positional relationship between the bottom surfaces of the two respective plugs.

In the conventional practice, it is difficult to change plasma density under the plug. To put it specifically, although the conventional mode of providing the single plug aims to even out the amount of ions discharged from the grid assembly by narrowing the space of the central area of the electric discharge chamber, the plasma density is still high in the central area of the electric discharge chamber. In other words, since the volume of plasma becomes smaller under the plug, the plasma density accordingly becomes higher under the plug. For this reason, the plasma generated under the plug is more likely to scatter toward the sidewall of the electric discharge chamber. As a result, it is difficult to adjust the plasma density under the plug. In sum, it can be said that the plug has the effect of changing the plasma density in the space outside the space under the plug, but almost none of the effect of changing the plasma density in the space under the plug.

In contrast to this, the embodiment is provided with an additional movable plug, which is adjacent to one movable plug, for the purpose of adjusting the amount of scatter of plasma under the plugs. For this reason, the effect of changing plasma density by one of the plugs can be exerted on the area under the other plug. Accordingly, even though neither plug is capable of exerting its effect of changing plasma density on the area under the plug of its own, the other plug's effect of changing plasma density covers the area under the one plug. As a consequence, the amount of scatter of plasma can be adjusted for the space under each of the plugs included in the ion beam source. For this reason, the plasma density profile can be more suitably adjusted in any specific one of the diameter directions, and the plasma density profile can be fine-tuned.

Furthermore, in the embodiment, the inner plug 305 is shaped like a cylinder; the outer plug 313 is shaped like a ring; and the inner plug 305 and the outer plug 313 are arranged in a way that the inner plug 305 and the outer plug 313 are coaxial with each other in the central portion of the upper surface of the ion beam source 300, and in a way that the cylindrical inner plug 305 is surrounded by the annular outer plug 313. Accordingly, the effect of compensating for plasma density, which is caused by the relative positional relationship between the inner plug 305 and the outer plug 313, can be reflected in all of the diameter directions of the ion beam source 300 in the same way.

Although the foregoing descriptions have been provided in the embodiment regarding the mode of using the two plugs, namely the inner plug 305 and the outer plug 313, it should be noted that the number of plugs is not limited to two but may be three or more. For example, a plug designed to surround the outer plug 313 may further be provided outside the outer plug 313.

Furthermore, the embodiment uses the cylindrical inner plug 305, and the annular outer plug 313 designed to surround the inner plug 305, as the two adjacent plugs. However, the shapes of the plugs are not limited to the foregoing. What is important in the embodiment is that two independently movable plugs are placed adjacent to each other. In this context, the shapes of the plugs are not limited as long as the plugs are placed as described above.

It should be noted that in this embodiment, the outer plug 313 functions as a shield configured to prevent or reduce an adhering film onto the sidewall 305b of the inner plug 305.

Figure 7:
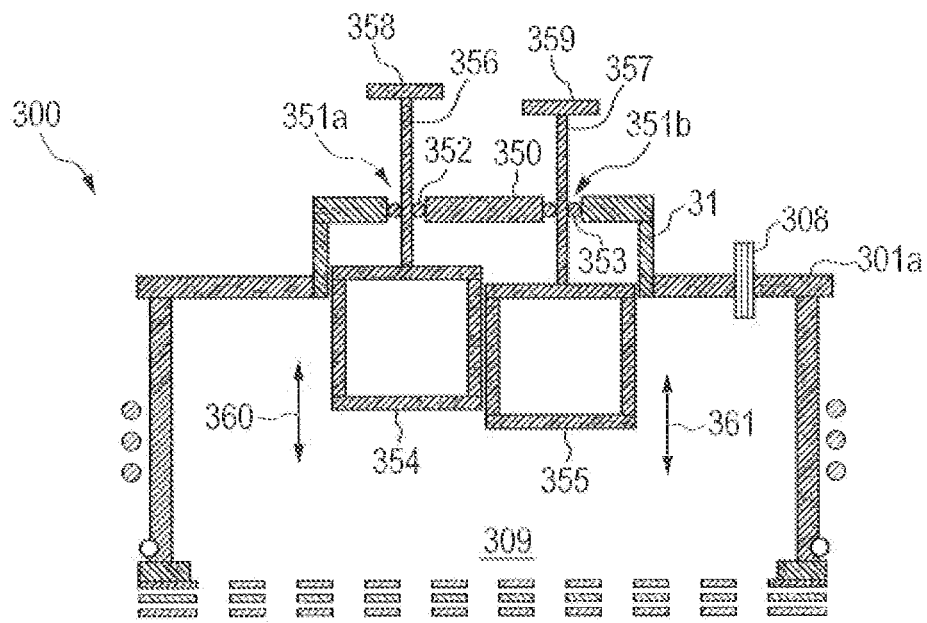
FIG. 7 is a diagram for explaining an example of a member movably provided in the ion beam generator of the embodiment of the present invention.

FIG. 7 is a diagram showing examples of plugs movably provided in the ion beam source 300 of the embodiment.

In FIG. 7, an annular plate 350 in which an opening and an opening 351b are formed is provided outside the annular plate 301a in a way that the openings 351a, 351b overlap the opening formed in the annular plate 301a. A support column 356 is inserted in the opening 351a. A plug 354 is connected to one end of the support column 356. A plug driving mechanism 358 is connected to the other end of the support column 356. An O-ring 352 is provided between the inner wall of the opening 351a and the support column 356. The O-ring 352 and the support column 356b are slidable over each other. It should be noted that the O-ring 352 is fixed to a groove formed in the inner wall of the opening 351a. Similarly, a support column 357 is inserted in the opening 351b. it plug 355 is connected to one end of the support column 357. A plug driving mechanism 359 is connected to the other end of the support column 357. An O-ring 353 is provided between the inner wall of the opening 351b and the support column 357. The O-ring 353 and the support column 357 are slidable over each other. It should be noted that the O-ring 353 is fixed to a groove formed in the inner wall of the opening 351b.

Each of the plugs 354, 355 is a rectangular parallelepiped, and is provided inside the electric discharge chamber (the internal space 309) of the ion beam source 300. The gap between the plugs 354, 355 is set narrow enough not to allow plasma to enter the gap, or at the Debye length or less (for example, 1 mm or less). In addition, the gap between the plug 354 and a chamber wall 31, and the gap between the plug 355 and the chamber wall 31 are each set narrow enough not to allow plasma to enter the gap, or at the Debye length or less (for example, 1 mm or less) as well. Accordingly, when the plug driving mechanisms 358, 359 are driven on the basis of drive commands from the control unit, albeit not illustrated, the plugs 354, 355 are capable of moving in respective arrow directions 360, 361 independently of each other as needed. The ion beam source 300 shown in FIG. 7 is capable of forming asymmetrical plasma.

Figure 8:
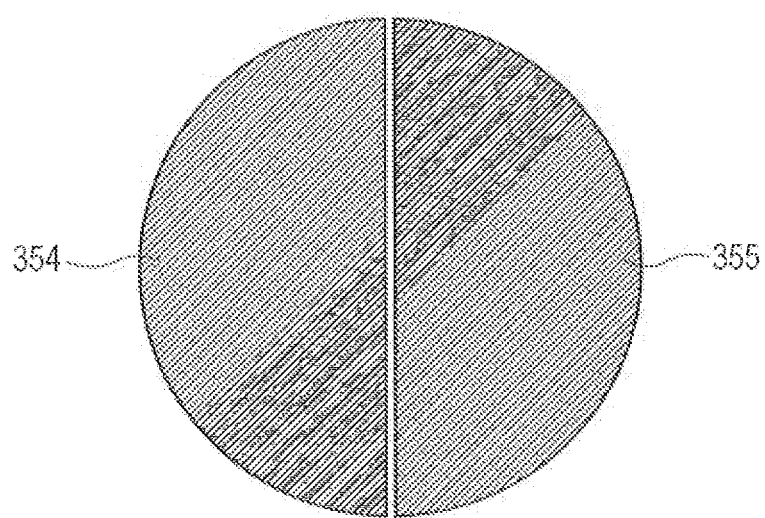
FIG. 8 is a top diagram of the member movably provided in the ion beam generator of the embodiment of the present invention.

It should be noted that: the shape of each of the plugs 354, 355 is not limited to the rectangular parallelepiped; and the plugs 354, 355 may be each shaped like a column or a half cylinder. FIG. 8 shows the upper surfaces of the plugs 354, 355 which are each formed as a half cylinder-shaped plug.

(Third Embodiment)

In the first embodiment, the descriptions have been provided for the mode which includes the shield configured to reduce the adhesion of the sputter particles onto the sidewall portion of the plug. In the second embodiment, the descriptions have been provided for the mode which uses the multiple plugs in order to control the plasma density profile in the broader range. It goes without saying that the technical ideas disclosed in the respective embodiments may be combined together. The following descriptions will be given of the embodiment in which two plugs are provided to a mode which includes a shield.

Figure 9:
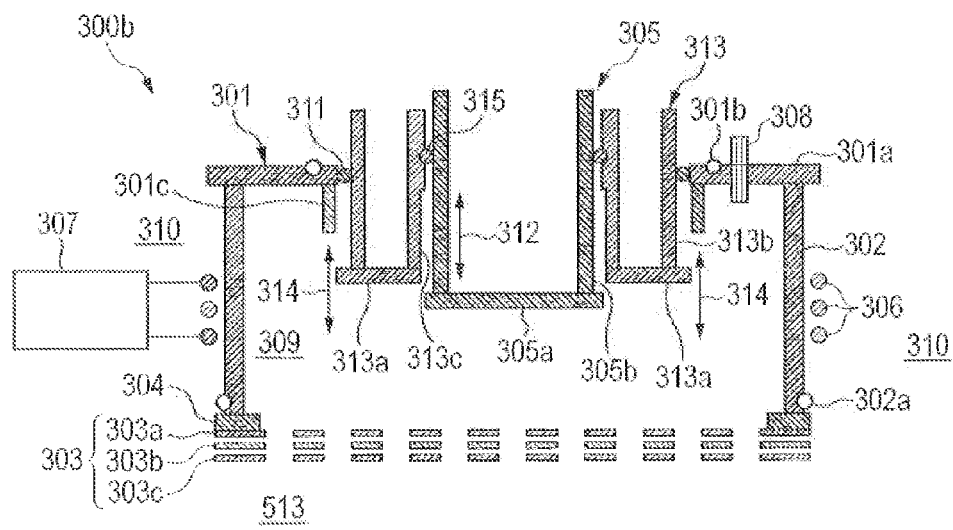
FIG. 9 is a cross-sectional diagram of an ion beam generator of an embodiment of the present invention.

FIG. 9 is a diagram showing an ion beam source 300b of the embodiment.

In the embodiment, the diameter of the annular bottom surface 313a is slightly larger than the diameter of the outer sidewall 313b of the outer plug 313. In other words, the outer plug 313 is formed in a way that the bottom surface 313a of the outer plug 313 juts out from the outer sidewall 313b thereof. In addition, a shield 301c, which extends from the inner edge of the annular plate 301a toward the grid assembly 303 and is provided so as to surround the outer sidewall 313b of the outer plug 313 along the outer circumference of the outer sidewall 313b thereof, is formed on the inner edge of the annular plate 301a on the side near the internal space 309. In other words, the shield 301c is a cylinder formed so as to surround the outer plug 313. One end of the cylinder is connected to the annular plate 301a on the side near the internal space 309. In the embodiment, the shield 301c is capable of preventing or reducing the accumulation of a film on the outer sidewall 313b of the outer plug 313 from the grid assembly 303 and the wafer during its process. In addition, in the embodiment, since the bottom surface 313a juts out from the outer sidewall 313b, it is possible to further reduce the accumulation of the film on the outer sidewall 313b. This enables the outer plug 313 to be operated smoothly.

The diameter of the bottom surface 305a of the inner plug 305 is slightly larger than the diameter of a cylindrical portion of the inner plug 305. In other words, the inner plug 305 is formed in a way that the bottom surface 305a of the inner plug 305 juts out from the sidewall 305b thereof. In addition, a step is formed on the inner sidewall 313c of the outer plug 313. For this reason, even though the diameter of the bottom surface 305a is larger than the diameter of the cylindrical portion of the inner plug 305, the bottom surface 305a allows the inner plug 305 to move appropriately without being blocked by the inner sidewall 313c, since the step is formed in an area of the inner sidewall 313c where the bottom surface 305a passes through. In this respect, the O-ring 315 is fixed to a groove formed in the inner sidewall 313c of the outer plug 313. In the embodiment, the inner sidewall 313c on which the step is formed and the larger bottom surface 305a can simultaneously bring about an effect of preventing or reducing the accumulation of a film on the sidewall 305b of the inner plug 305, and an effect of enabling the inner plug 305 to move smoothly.

Figure 10:
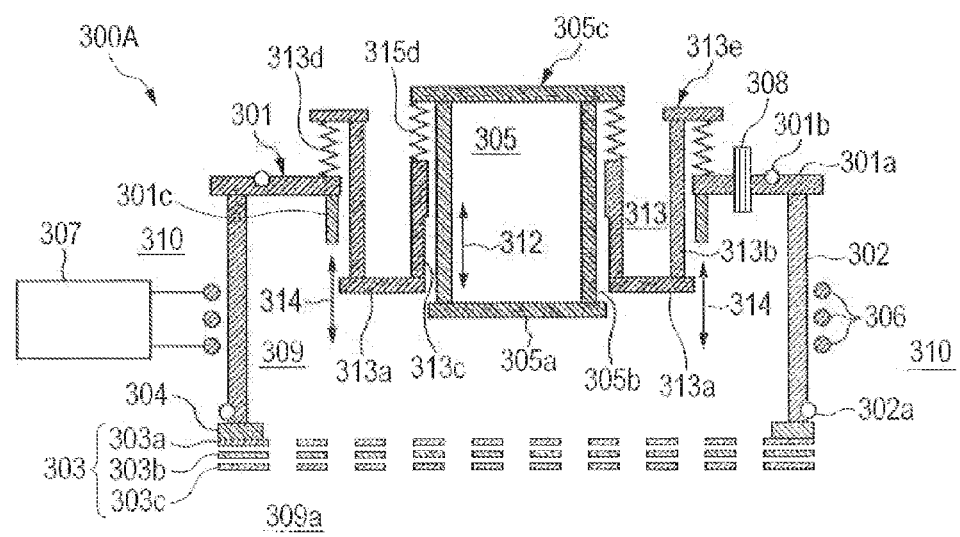
FIG. 10 is a cross-sectional diagram of an ion beam generator of the embodiment of the present invention.

FIG. 10 is a diagram showing another example of the ion beam source 300A of the embodiment. Since the configuration of an ion beam source 300A shown in FIG. 10 is basically the same as the configuration shown in FIG. 9, descriptions will be provided only for differences therebetween. In the configuration shown in FIG. 10, the hermetic sealing of the ion beam source 300A is secured by using an expandable and contractible material (for example, bellows) instead of the O-ring.

In FIG. 10, the diameter of an upper wall 305c of the inner plug 305 is slightly larger than the diameter of the cylindrical portion of the inner plug 305; and a cylindrical bellows 315d is provided between the upper wall 305c and the upper end of the inner sidewall 313c of the outer plug 313. In other words, one end of the bellows 315d is connected to the portion of the upper wall 305c which juts out from the sidewall 305b, and the other end of the bellows 315d is connected no the upper end of the inner sidewall 313c. For this reason, even though the inner plug 305 is moved in the arrow directions 312, a movable range in the arrow directions 312 can be secured for the inner plug 305 because of the expandable and contractible nature of the bellows 315d, and the hermetic sealing can be secured because of the presence of the cylindrical bellows 315d between the upper wall 305c and the upper end of the inner sidewall 313c.

Similarly, the diameter of an annular upper wall 313e of the outer plug 313 is slightly larger than the diameter of the outer sidewall 313b of the outer plug 313. In addition, the upper wall 313e is provided on the opposite side from the grid assembly 303 with respect to the annular plate 301a. In this configuration, a bellows 313d is provided between the upper wall 313e and the annular plate 301a. In other words, one end of the bellows 313d is connected to the upper wall 313e, and the other end of the bellows 313d is connected to the annular plate 301a. For this reason, even though the outer plug 313 is moved in the arrow directions 314, a movable range in the arrow directions 314 can be secured for the outer plug 313 because of the expandable and contractible nature of the bellows 313d and the bellows 315d, and the hermetic sealing can be secured because of the presence of the cylindrical bellows 313d between the upper wall 313e and the annular plate 301a.

Since as described above, the upper wall 301 of the electric discharge chamber and the outer plug 313 are connected to each other by the bellows 313d while the outer plug 313 and the inner plug 305 are connected to each other by the bellows 315d, it is possible to hermetically seal the area defined by the electric discharge chamber, the inner plug 305 and the outer plug 313 while moving the inner plug 305 and the outer plug 313 relative so each other. Furthermore, while the inner plug 303 and the outer plug 313 are being moved, particles which would be otherwise produced from the sidewalls of the plugs during the movement of the plugs can be inhibited since there are no sliding actions between the sidewalls of the plugs and members such as O-rings for the hermetic sealing.

Figure 11:
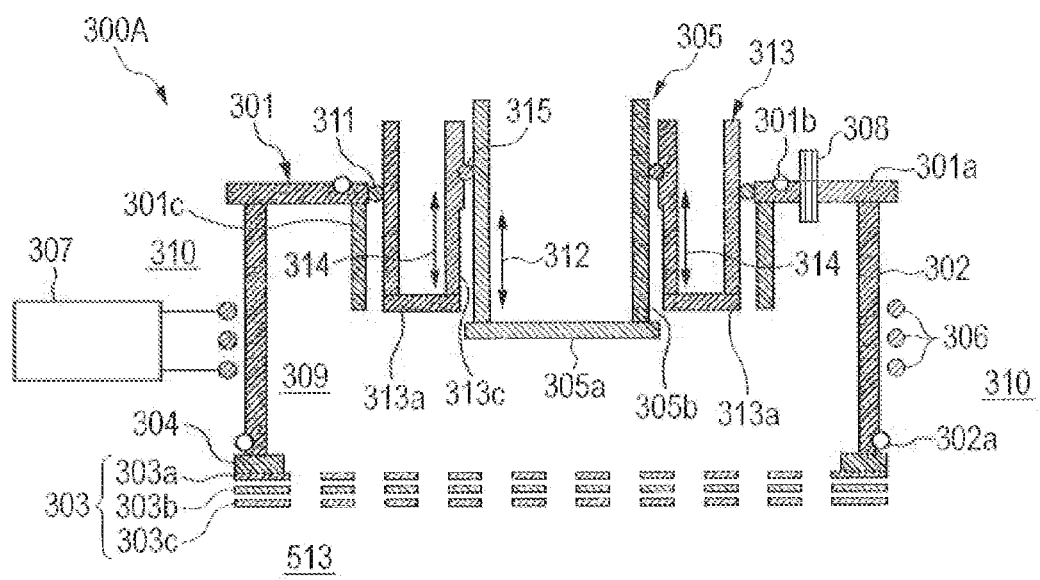
FIG. 11 is a cross-sectional diagram of an ion beam generator of the embodiment of the present invention.

FIG. 11 is a diagram showing yet another example of the ion beam source 300A of the embodiment.

In FIG. 11, the diameter of the bottom surface 305a of the inner plug 305 is slightly larger than the diameter of the cylindrical portion of the inner plug 305, and the step is formed on the inner sidewall 313c of the outer plug 313. In addition, the shield 301c is provided on the inner edge of the annular plate 301a on the side near the internal space 309.

Figure 12:
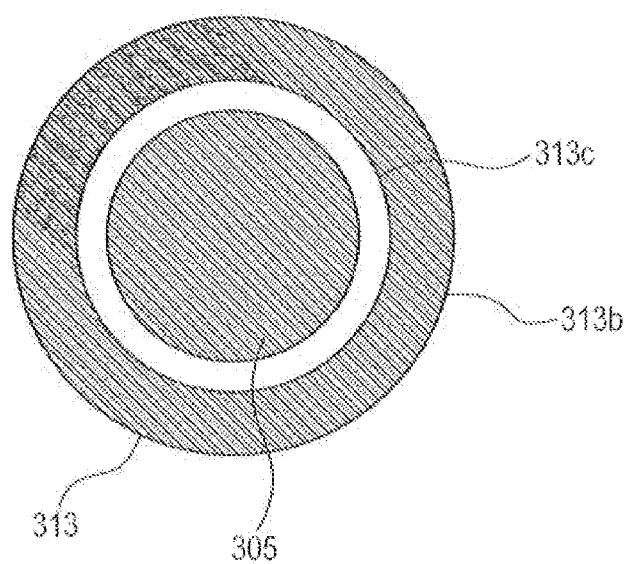
FIG. 12 is a top diagram of two plugs shown in each of FIGS. 6 and 9 to 11.

FIG. 12 is a schematic diagram of the inner plug 305 and the outer plug 313 of the embodiment viewed from the grid assembly 303. As shown in FIG. 12, the annular plug 313 is provided around the cylindrical inner plug 305.

(Fourth Embodiment)

A permanent magnet and an electromagnet are effective in controlling the plasma density profile in the plasma chamber. In addition, the slight inclination or offsetting of the electromagnet makes it possible to reduce the asymmetry of the plasma density profile. Meanwhile, the magnetic field from the electromagnet and the magnetic field from scatteringly distributed permanent magnets easily spread to the outside of the ion beam source and the inside of the ion beam chamber. This leakage of the magnetic field tends to adversely affect the beam neutralization. It is desirable that the area between the grid and the substrate be an area with no magnetic field. An object of the embodiment is to provide an ion beam source capable of reducing the leakage of the magnetic field to the outside of the ion beam source.

Figure 13:
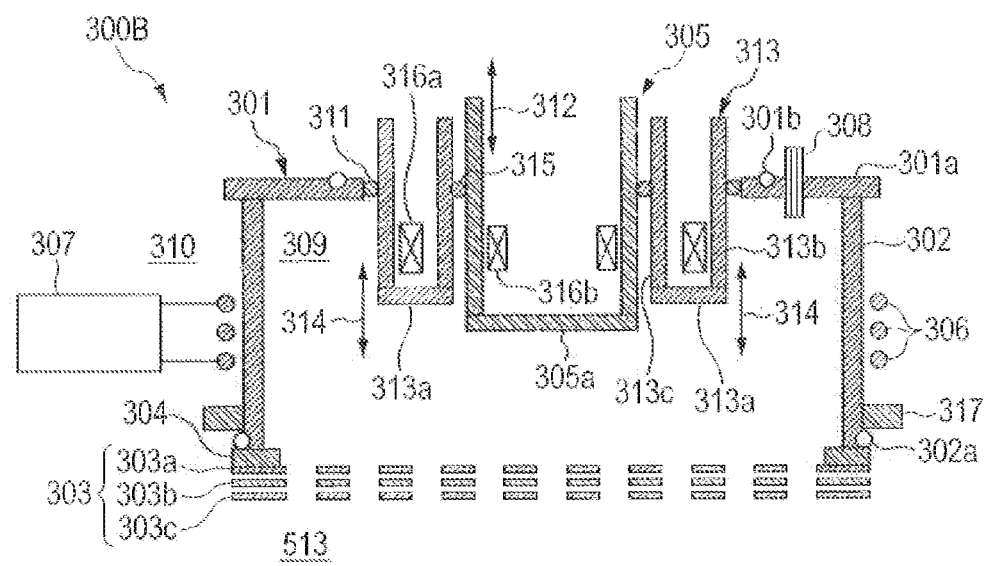
FIG. 13 is a cross-sectional diagram of an ion beam generator of an embodiment of the present invention.

FIG. 13 is a diagram showing an ion beam source of the embodiment.

In FIG. 13, an ion beam source 300B includes: the ion beam source 300 of the second embodiment; a first annular electromagnet 316a provided inside the outer plug 313; a second annular electromagnet 316b provided inside the inner plug 305; and an annular permanent magnet assembly 317 provided on the sidewall 302 above an electrode placement ring 304, or between the grid assembly 303 and the antenna 306. It is desirable that the electromagnets 316a, 316b each include: a circular wiring (not illustrated) almost in parallel with the annular plate 301a; and an electromagnet cooling unit (not illustrated). The electromagnet 316a may be attached to the outer plug 313 and moved together with the outer plug 313 in the arrow directions 314. The electromagnet 316b may also be attached to the inner plug 305 and moved together with the inner plug 305 in the arrow directions 312. Meanwhile, at least one of the electromagnet 316a. and the electromagnet 316b may be placed in a fixed position relative to the annular plate 301a.

Furthermore, it is desirable that the direction of an electric current flowing in one of the electromagnet 316a and the electromagnet 316b be set opposite to the direction of an electric current flowing in the other one of the electromagnet 310a and the electromagnet 316b. The setting of the directions of the electric currents flowing in the electromagnet 316a and the electromagnet 316b in this manner makes it possible to reduce the leakage of the electric fields to the external space 513, particularly the vicinity of the center of the third electrode 303c.

The permanent magnet assembly 317 is configured to minimize the leakage of the magnetic fields to the outer place 513 by causing lines of magnetic forces from the electromagnets 316a, 316b to reach the permanent magnet assembly 317. Since the permanent magnet assembly 317 includes permanent magnets, the permanent magnet assembly 317 is capable of fixing the desirable directions of the electric currents flowing in the electromagnets 316a, 316b.

The electromagnets 316a, 316b are placed coaxially with the sidewall 302. However, the electromagnets 316a, 316b may be offset from the center position for the purpose of compensating for the asymmetry of the plasma. Instead of or in addition to this, the electromagnet 316a, 316b may be inclined to the upper wall 301.

Figure 14:
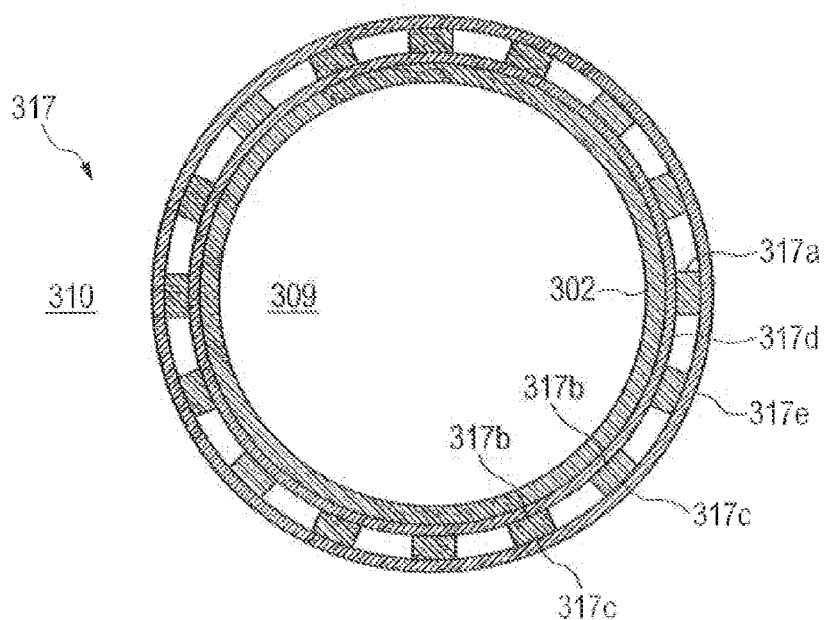
FIG. 14 is a cross-sectional diagram of a permanent magnet assembly of the embodiment of the present invention, which is viewed from above.

FIG. 14 is a cross-sectional diagram for explaining the permanent magnet assembly 317 of the embodiment which is viewed from above. In the embodiment, as shown in FIG. 13, the ion beam source 300B is provided with the permanent magnet assembly 317 together with the electromagnets 316a, 316b. The permanent magnet assembly 317 includes the multiple permanent magnets 317a arranged around the sidewall 302 (shown for the purpose of explanation in FIG. 14) of the ion beam source 300B. A pole 317b of each permanent magnet 317a is directed to the sidewall 302 (to the internal space 309), while the other pole 317c of each permanent magnet 317a is directed away from the sidewall 302 (to the outer region 310). It is desirable that the same poles of all the permanent magnets 317a be directed to the sidewall 302. A first transmissive ring 317d and a second transmissive ring 317e may be provided for the purpose of: homogenizing the magnetic field in the internal space 309; and mechanically supporting the permanent magnets 317a. In the embodiment, since the directions of the poles of the permanent magnets 317a are fixed, it is possible to prevent or reduce the leakage of a large magnetic field to the external space 513 by operating each electromagnet by use of one current polarity.

It goes without saying that the embodiment may be provided with the shield 301c.

(Fifth Embodiment)

Figure 15:
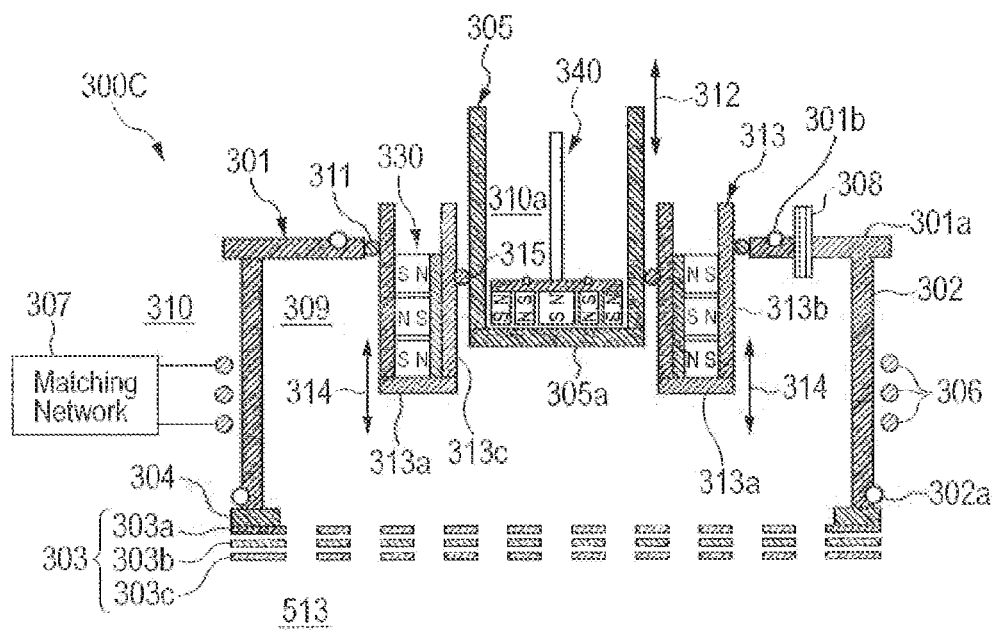
FIG. 15 is a cross-sectional diagram of an ion beam generator of an embodiment of the present invention.

FIG. 15 is a diagram showing an ion beam source of the embodiment.

In FIG. 15, in addition to the ion beam source 300 of the second embodiment, an ion beam source 300C includes a first permanent magnet assembly 330 provided inside the outer plug 313 and serving as a magnetic field applying unit, and a second permanent magnet assembly 340 provided inside the inner plug 305 and serving as a magnetic field applying unit.

The first permanent magnet assembly 330 is configured to form a multi-cusp magnetic field pattern, which is in contact with the outside of the outer sidewall 313b of the outer plug 313, in the internal space 309. The first permanent magnet assembly 330 makes it possible to reduce a plasma loss on the outer sidewall 313b.

The second permanent magnet assembly 340 is configured to form a multi-cusp magnetic field pattern, which is in contact with the outside of the bottom surface 305a of the inner plug 305, in the internal space 309. The second permanent magnet assembly 340 makes it possible to reduce a plasma loss on the bottom surface 305a. The multi-cusp magnetic fields are sharply attenuated with the distances from the first and second permanent magnet assemblies 330, 340. For this reason, it is possible to reduce the leakage of the magnetic fields to the external space 513 to a very small amount.

Figure 16A:
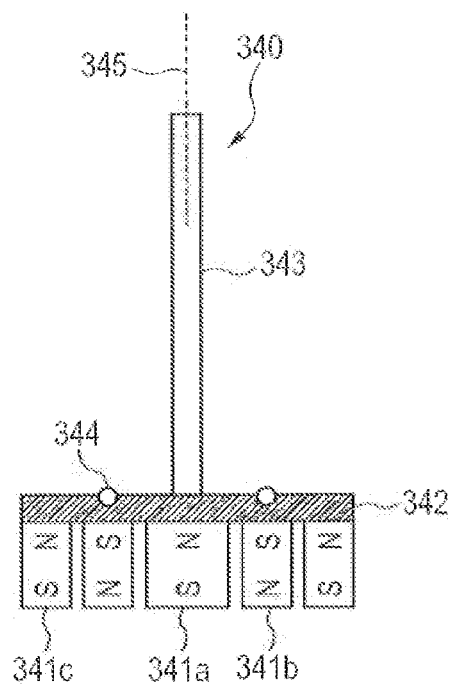
FIG. 16A is a cross-sectional diagram of a permanent magnet assembly of the embodiment of the present invention, which is placed in the vicinity of a bottom surface of an inner plug.
Figure 16B:
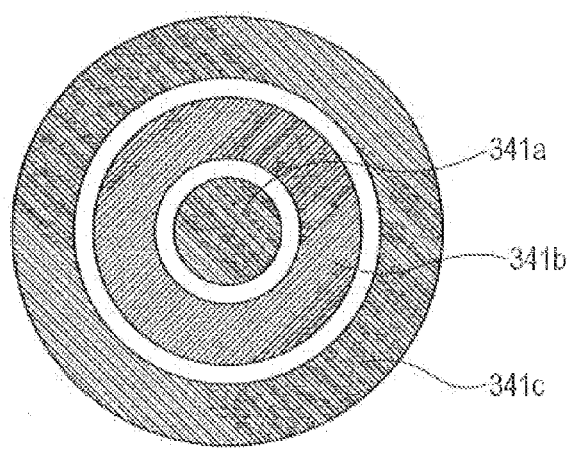
FIG. 16B is a diagram of the permanent magnet assembly shown in FIG. 16A, which is viewed from below.

FIG. 16A is a cross-sectional diagram of the second permanent magnet assembly 340 of the embodiment placed in the vicinity of the bottom surface of the inner plug. FIG. 16B is a diagram of the second permanent magnet assembly 340 shown in FIG. 16A, which is viewed from below. In FIGS. 16A and 16B, a first magnet 341a, a second magnet 341b, and a third magnet 341c are coaxially provided on a circular plate 342. The first magnet 341a is columnar and is placed in the center. The second magnet 341b is annular and is provided surrounding the first magnet 341a. The third magnet 341c is annular and is provided surrounding the second magnet 341b.

In FIG. 16A, the first to third magnets 341a to 341c are placed in a way that the polarities (denoted by symbols S and N in FIG. 16A) of the magnets appearing on the grid assembly 303 side are alternated. Each of the second magnet 341b and the third magnet 341c may be formed from multiple magnets in a way that the multiple magnets form one annular magnet. In addition, the number of magnets included in the second permanent magnet assembly 340 is not limited to three. Depending on the size of the inner plug 305, the second permanent magnet assembly 340 may use as many (for example, three or more) magnets as needed to form the multi-cusp magnet field pattern. Moreover, the multi-cusp magnetic field pattern does not have to be uniform. Furthermore, a rod 343 is connected to the circular plate 342 for the purpose of positioning the second permanent magnet assembly 340 in the inner plug 305. What is more, a cooling unit 344 may be provided to the second permanent magnet assembly 340 in order to prevent the first to third magnets 341a to 341c from being excessively heated by radiation or conduction from the bottom surface 305a.

In the embodiment, since the first to third magnets 341a to 341c included in the second permanent magnet assembly 340 are placed coaxially, the second permanent magnet assembly 340 need not be rotated about an axis 345. Nevertheless, the axis 345 may be placed slightly off the center of the bottom surface 305a of the inner plug 305 in order to compensate for the asymmetry of the plasma density profile. Furthermore, the second permanent magnet assembly 340 may be moved up and down relative to the bottom surface 305a. This makes it possible to adjust the plasma density under the bottom surface 305a more appropriately.

As is usually the case, a plasma loss becomes larger on the sidewall or the like of the chamber which faces the plasma. In the embodiment, because of the provision of the inner plug 305 and the outer plug 313, the outer sidewall 313b and the inner sidewall 313c of the outer plug 313 as well as the bottom surface 305a of the inner plug, in addition to the sidewall of the electric discharge chamber, face the plasma in the electric discharge chamber. This increases the number of sidewall portions facing the plasma. Accordingly, the plasma loss may be increased on the sidewalls. The embodiment, however, is capable of reducing the plasma loss on each of the increased sidewall portions since the embodiment is provided with: the first permanent magnet assembly 330 configured to form the cusp magnetic field on the sidewall surface of the outer plug 313; and the second permanent magnet assembly 340 configured to form the cusp magnetic field on the surface of the bottom surface 305a of the inner plug 305.

It should be noted that if the cusp magnetic field can be formed on at least part (the sidewall or the bottom surface) of the area of each plug adjacent to the plasma in the internal space 309, the embodiment is capable of reducing the plasma loss on the increased sidewall portion. For this reason, it is desirable that the first permanent magnet assembly 330 and the second permanent magnet assembly 340 be configured to form the cusp magnet field on at least one of the sidewall side and the bottom surface side of each plug.

In addition, it is needless to say that the embodiment may be provided wire the shield 301c.

(6th Embodiment)

Figure 17:
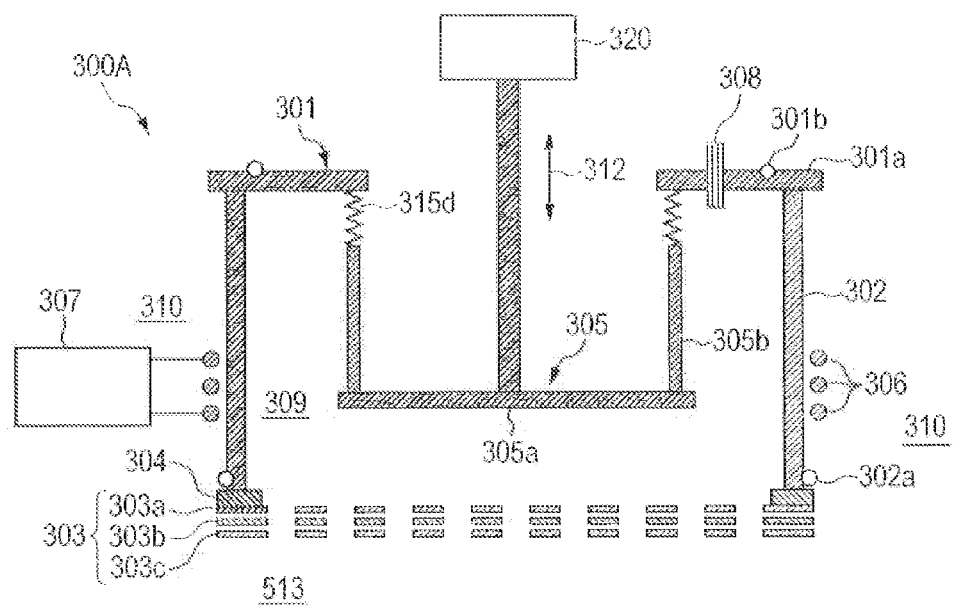
FIG. 17 is a cross-sectional diagram of an ion beam generator of an embodiment of the present invention.

FIG. 17 is a diagram showing an ion beam source of the embodiment.

The configuration of an ion beam source 300A shown in FIG. 17 is basically the same as that shown in FIG. 10. For this reason, descriptions will be provided only for differences therebetween. The cylindrical bellows 315d is provided from an inner portion of the annular plate 301a (on the internal space 309 side) toward the grid assembly 303. In addition, the cylindrical plug 305 facing the grid assembly 303 is provided in an annular tip portion of the cylindrical bellows 315d. In other words, the bellows 315d is provided in a way that: the bellows 315d seals a gap between the upper wall 301 and an end portion of the cylindrical sidewall 305b of the cylindrical plug 305, which is opposite from the bottom surface 305a; and the bellows 315d is expandable and contractible in the arrow directions 312 representing the movement directions of the plug 305. The bellows 315d provided in this way has: a function of securing the hermetic sealing of the internal space 309; and a function of making the plug 305 movable in the arrow directions 312. For this reason, although the O-ring configured to hermetically seal the internal space 309 is not used, the plug 305 can be moved while securing the hermetic sealing of the internal space 309.

The embodiment includes no members which slide over the sidewall 305b of the plug 305 during the movement of the plug 305. For this reason, even if an adhering matter is formed on the sidewall 305b, the movement of the plug 305 in the arrow directions 312 will not be blocked by the adhering matter. Accordingly, even if the sputter particles derived from the grid assembly 303 are produced, the plug 305 can be moved appropriately. In addition, even if a film adheres to the bellows 315d, the plug 305 remains movable. Furthermore, it is possible to prevent or reduce particles which would be produced if the O-ring is used as a sealing member.

Figure 18:
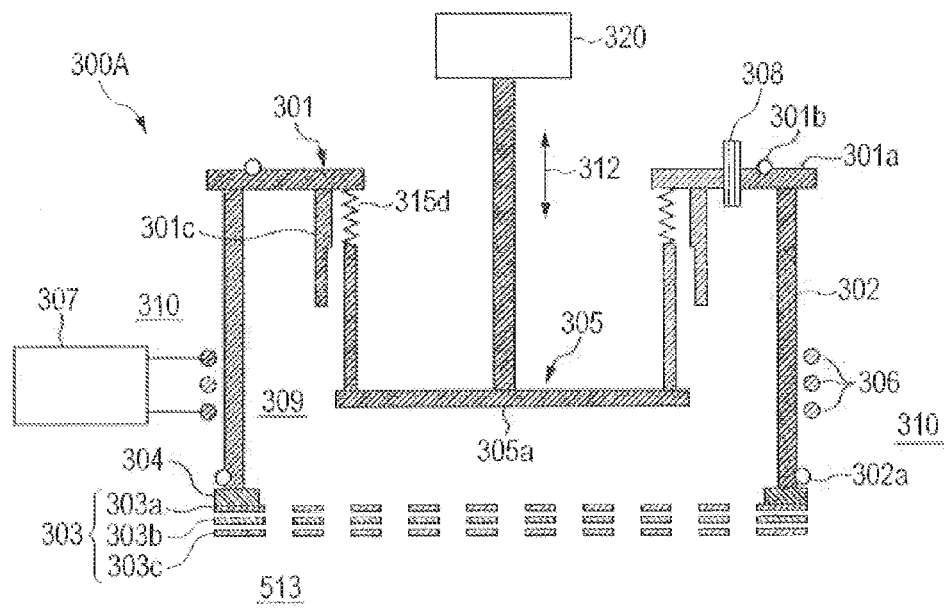
FIG. 18 is a cross-sectional diagram of an ion beam generator of the embodiment of the present invention.

FIG. 18 is a diagram showing another ion beam source of the embodiment. The configuration of an ion beam source 300A shown in FIG. 18 is basically the same as that shown in FIG. 17. For this reason, descriptions will be provided only for differences therebetween. In this example, the shield 301c configured to prevent or reduce the adhesion of a film onto the bellows 315d is provided around the cylindrical bellows 315d. This makes it possible to prevent or reduce particles which would be produced if the film is attached onto the bellows 315d.

Figure 19:
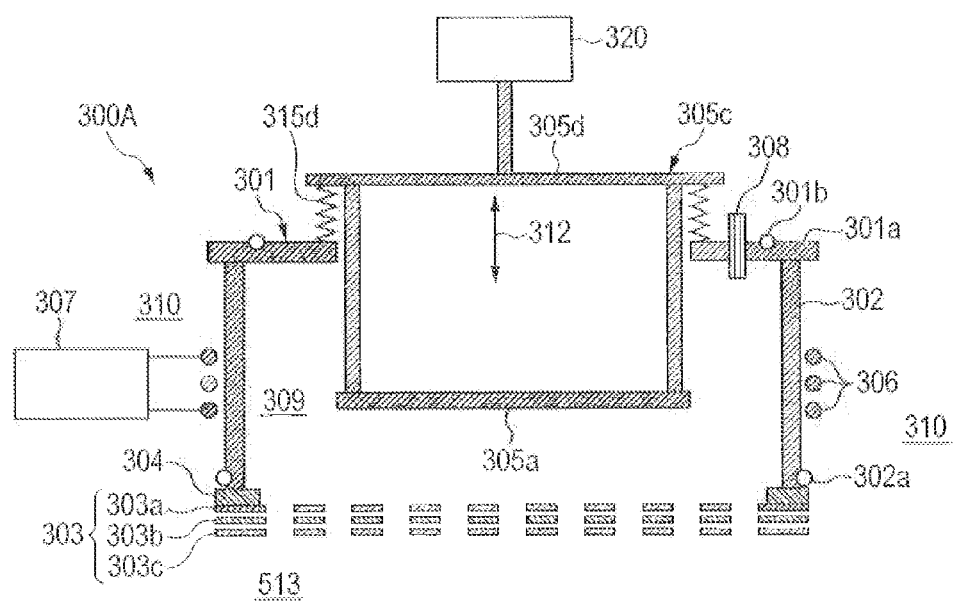
FIG. 19 is a cross-sectional diagram of an ion beam generator of the embodiment of the present invention.

FIG. 19 is a diagram showing another ion beam source of the embodiment. The configuration of an ion beam source 300A shown in FIG. 19 is basically the same as that shown in FIG. 17. For this reason, descriptions will be provided only for differences therebetween. In this example, the cylindrical bellows 315d is provided from the outside of the annular plate 301a in a direction which is opposite to the grid assembly 303. Furthermore, a disc member 305d is provided to an annular tip portion of the cylindrical bellows 315d. A cylindrical plug 305 whose diameter is smaller than that of the cylindrical bellows 315d is provided from the inside of the disc member 305d toward the grid assembly 303.

The above-described configuration makes it possible to prevent or reduce the direct adhesion of a film onto the bellows 315d, and accordingly to prevent or reduce particles which would be otherwise produced.

Figure 20:
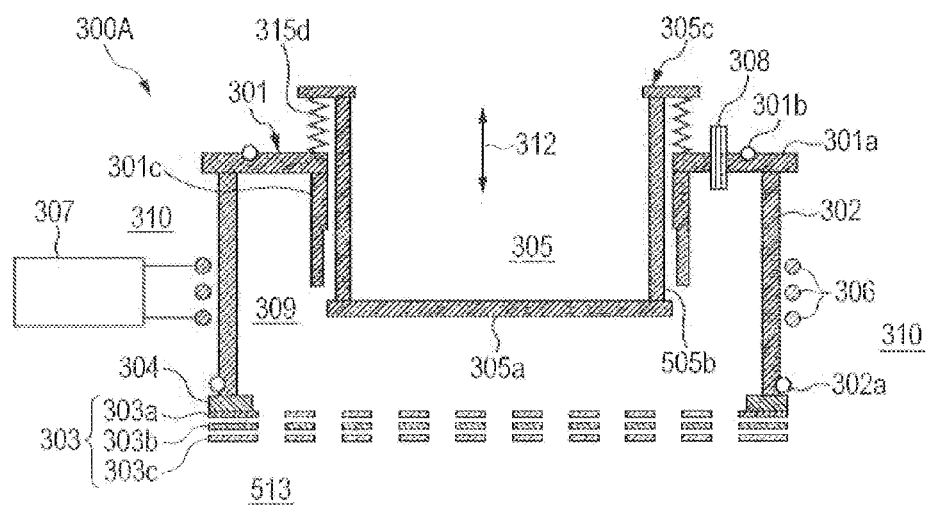
FIG. 20 is a cross-sectional diagram of an ion beam generator of the embodiment of the present invention.

FIG. 20 is a diagram showing yet another ion beam source of the embodiment. The configuration of an ion beam source 300A shown in FIG. 20 is basically the same as that shown in FIG. 10. For this reason, descriptions will be provided only for differences therebetween. The configuration shown in FIG. 20 does not use the outer plug 313. In addition, a step is formed in the inner sidewall of the shield 301c. Accordingly, even though the diameter of the bottom surface 305a of the plug 305 is larger than the diameter of the cylindrical portion of the inner plug 305, the inner plug 305 can be moved appropriately while preventing the bottom surface 305a from being blocked by the inner sidewall of the shield 301c since the step is formed in the area of the inner sidewall of the shield 301c where the bottom surface passes through. This configuration can simultaneously bring about: the effect of preventing or reducing the accumulation of a film on the sidewall 305b of the inner plug 305; and the effect of enabling the inner plug 305 to move smoothly.

(7th Embodiment)

Figure 21:
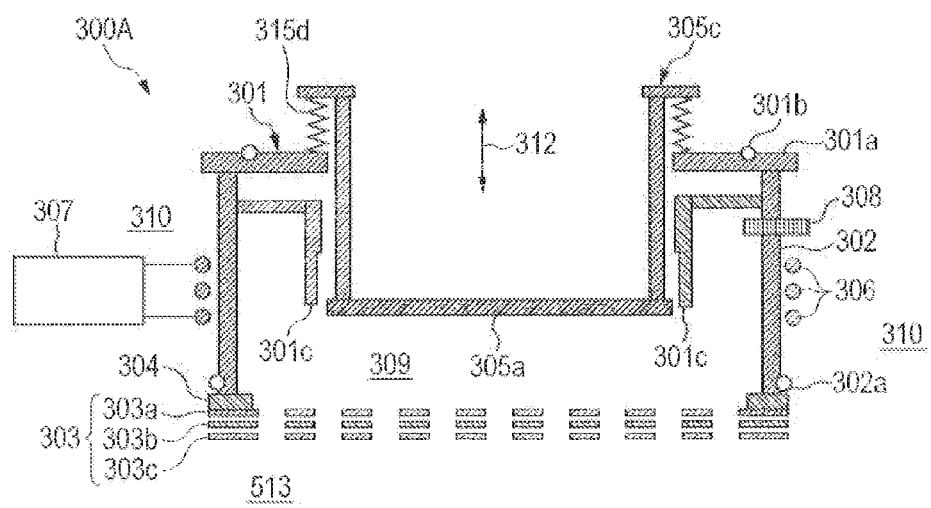
FIG. 21 is a cross-sectional diagram of an ion beam generator of an embodiment of the present invention.

FIG. 21 is a diagram showing still another ion beam source of the embodiment. The configuration of an ion beam source 300A shown in FIG. 21 is basically the same as that shown in FIG. 17. For this reason, descriptions will be provided only for differences therebetween. In the configuration shown in FIG. 21, the shield 301c extends from the sidewall 302 of the electric discharge chamber toward the plug 305, and bends along the plug 305 toward the grid assembly 203.

In the present invention, it is important that the shield 301c be configured to reduce the adhesion of the grid assembly-derived sputter particles flying from the grid assembly onto the sidewall of each plug. To this end, as shown in FIG. 4 and FIG. 21, the shield is designed at least to have the part extending toward the grid assembly (203, 303) from the upper wall (201, 301) opposed to the grid assembly (203, 303) (in the movement directions of the plug 205, 305). For example, in the configuration shown in FIG. 4, the shield 201c only needs to be capable of at least partially covering the portions of the sidewall 205b and the O-ring 211 which slide over each other in accordance with the movement of the plug 205 in the arrow directions 212. To this end, the shield 201c needs at least to have the portion extending from the upper wall 201 toward the grid assembly 203.

In the present invention, the target to be shielded by the shield from the grid assembly-derived sputter particles is the sidewall of each plug, and the sidewall is the wall of the plug extending in the movement directions of the plug. For this reason, if the shield has at least the area extending in the movement directions, the area makes it possible to reduce the adhesion of the grid assembly-derived sputter particles onto the sidewall.

It should be noted that since the plug moves in the first direction from the upper wall toward the grid assembly opposed to the upper wall and in the second direction which is the direction opposite to the first direction, the movement directions of the plug agree with the direction from the upper wall toward the grid assembly.

The ion beam generator of the present invention can be made by combining any features which have described in the embodiments.

The invention claimed is:

1. An ion beam generator comprising:
a chamber;
a unit configured to generate plasma in the chamber;
an extraction unit provided opposed to a predetermined wall of the chamber, and configured to extract ions from the plasma;
a member configured to adjust plasma density in the chamber, and be movable in the chamber in a first direction from the wall toward the extraction unit and in a second direction from the extraction unit toward the wall;
a second member provided adjacent to the member and configured to adjust the plasma density in the chamber, and be movable in the chamber in the first direction and the second direction independently of the member;
a seal member configured to seal a gap between the wall and a sidewall of the member, and having a slidable relationship with the member; and
a shield configured to at least partially cover portions of the sidewall of the member and the seal member which slide over each other with a movement of the member, and having at least a portion extending from the wall toward the extraction unit,
wherein the member is a cylindrical member,
wherein the second member is an annular member provided surrounding the cylindrical member, and
wherein the member and the second member are provided coaxially with each other.

2. The ion beam generator according to claim 1,
wherein an electromagnet is provided inside each of the member and the second member, and
wherein a direction of an electric current flowing in the electromagnet provided inside the member and a direction of an electric current flowing in the electromagnet provided inside the second member are set opposite to each other.

3. The ion beam generator according to claim 1,
wherein the member includes the sidewall and a bottom surface, and
wherein part of the bottom surface juts out from the sidewall.

4. The ion beam generator according to claim 3, further comprising a magnetic field applying unit provided inside the member, and configured to form a cusp magnetic field on a sidewall side and a bottom surface side of the member.

5. An ion beam plasma processing apparatus comprising the ion beam generator according to claim 1.

6. An ion beam generator comprising:
a chamber;
a unit configured to generate plasma in the chamber;
an extraction unit provided opposed to a predetermined wall of the chamber, and configured to extract ions from the plasma;

a member configured to adjust plasma density in the chamber, and be movable in the chamber in a first direction from the wall toward the extraction unit and in a second direction from the extraction unit toward the wall;

a second member provided adjacent to the member and configured to adjust the plasma density in the chamber, and be movable in the chamber in the first direction and the second direction independently of the member; and an expandable and contractible member configured to seal a gap between the wall and a sidewall of the member, and be expandable and contractible in the first and second directions, wherein the member is a cylindrical member, wherein the second member is an annular member provided surrounding the cylindrical member, and wherein the member and the second member are provided coaxially with each other.

* * * * *